United States Patent
Noh

(10) Patent No.: US 11,495,473 B2
(45) Date of Patent: Nov. 8, 2022

(54) SEMICONDUCTOR DEVICE AND MANUFACTURING METHOD OF SEMICONDUCTOR DEVICE

(71) Applicant: SK hynix Inc., Icheon-si (KR)

(72) Inventor: Yoo Hyun Noh, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 11 days.

(21) Appl. No.: 17/161,168

(22) Filed: Jan. 28, 2021

(65) Prior Publication Data

US 2022/0028701 A1  Jan. 27, 2022

(30) Foreign Application Priority Data

Jul. 27, 2020 (KR) .......................... 10-2020-0093262

(51) Int. Cl.
| | |
|---|---|
| *H01L 21/48* | (2006.01) |
| *H01L 27/06* | (2006.01) |
| *H01L 23/538* | (2006.01) |
| *H01L 21/768* | (2006.01) |
| *H01L 27/11582* | (2017.01) |
| *H01L 27/11556* | (2017.01) |

(52) U.S. Cl.
CPC ...... *H01L 21/486* (2013.01); *H01L 21/76802* (2013.01); *H01L 21/76877* (2013.01); *H01L 23/5384* (2013.01); *H01L 23/5386* (2013.01); *H01L 27/0688* (2013.01); *H01L 27/11556* (2013.01); *H01L 27/11582* (2013.01)

(58) Field of Classification Search
CPC .......... H01L 27/0688; H01L 27/11556; H01L 27/11582; H01L 27/11526; H01L 27/11573
See application file for complete search history.

(56) References Cited

U.S. PATENT DOCUMENTS

| | | | | |
|---|---|---|---|---|
| 9,842,855 | B2 * | 12/2017 | Lee | ..................... H01L 27/0688 |
| 9,941,291 | B2 * | 4/2018 | Lee | .................. H01L 29/66666 |
| 9,985,048 | B2 * | 5/2018 | Lee | ..................... H01L 27/1157 |
| 10,553,609 | B2 * | 2/2020 | Lee | .................. H01L 27/11582 |

(Continued)

FOREIGN PATENT DOCUMENTS

| | | |
|---|---|---|
| KR | 1020020054710 A | 7/2002 |
| KR | 1020070063585 A | 6/2007 |

(Continued)

*Primary Examiner* — Bac H Au
(74) *Attorney, Agent, or Firm* — William Park & Associates Ltd.

(57) ABSTRACT

A method of manufacturing a semiconductor device includes forming a stacked structure with first material layers and second material layers that are stacked alternately with each other, forming a first slit that passes through the stacked structure, forming a second slit that passes through the stacked structure, forming a contact hole between the first slit and the second slit that passes through the stacked structure, forming a sealing layer that seals the first slit, the second slit and the contact hole, forming first openings that pass through the sealing layer to form first sealing regions and partially expose the first slit to form first exposed regions, forming a first slit insulating layer by filling the first exposed regions and first sealing regions, etching the sealing layer to open the contact hole, and forming a first contact plug in the contact hole.

20 Claims, 33 Drawing Sheets

(56) References Cited

U.S. PATENT DOCUMENTS

| | | | | |
|---|---|---|---|---|
| 10,700,079 | B2* | 6/2020 | Park | H01L 21/823487 |
| 10,985,180 | B2* | 4/2021 | Jeon | H01L 27/11565 |
| 11,069,700 | B2* | 7/2021 | Sakata | H01L 27/11565 |
| 2016/0268263 | A1* | 9/2016 | Lee | H01L 27/11507 |
| 2017/0025545 | A1* | 1/2017 | Nam | H01L 27/0688 |
| 2017/0213843 | A1* | 7/2017 | Choi | H01L 29/4232 |
| 2017/0256588 | A1* | 9/2017 | Fukuda | H01L 21/311 |
| 2019/0296041 | A1* | 9/2019 | Yamasaka | H01L 27/11582 |
| 2019/0333929 | A1* | 10/2019 | Lee | H01L 27/1157 |
| 2020/0203364 | A1* | 6/2020 | Totoki | H01L 27/11519 |
| 2020/0258817 | A1* | 8/2020 | Okina | H01L 27/11573 |
| 2020/0303406 | A1* | 9/2020 | Komiya | H01L 27/11573 |
| 2021/0111258 | A1* | 4/2021 | Fulford | H01L 29/66795 |
| 2021/0257301 | A1* | 8/2021 | Matsumoto | H01L 21/76895 |
| 2021/0366824 | A1* | 11/2021 | Chung | H01L 21/76816 |
| 2022/0084957 | A1* | 3/2022 | Nanami | H01L 21/76816 |

FOREIGN PATENT DOCUMENTS

| | | | |
|---|---|---|---|
| KR | 1020170136364 | A | 12/2017 |
| KR | 1020190024579 | A | 3/2019 |
| KR | 1020190026418 | A | 3/2019 |
| KR | 1020190139439 | A | 12/2019 |

* cited by examiner

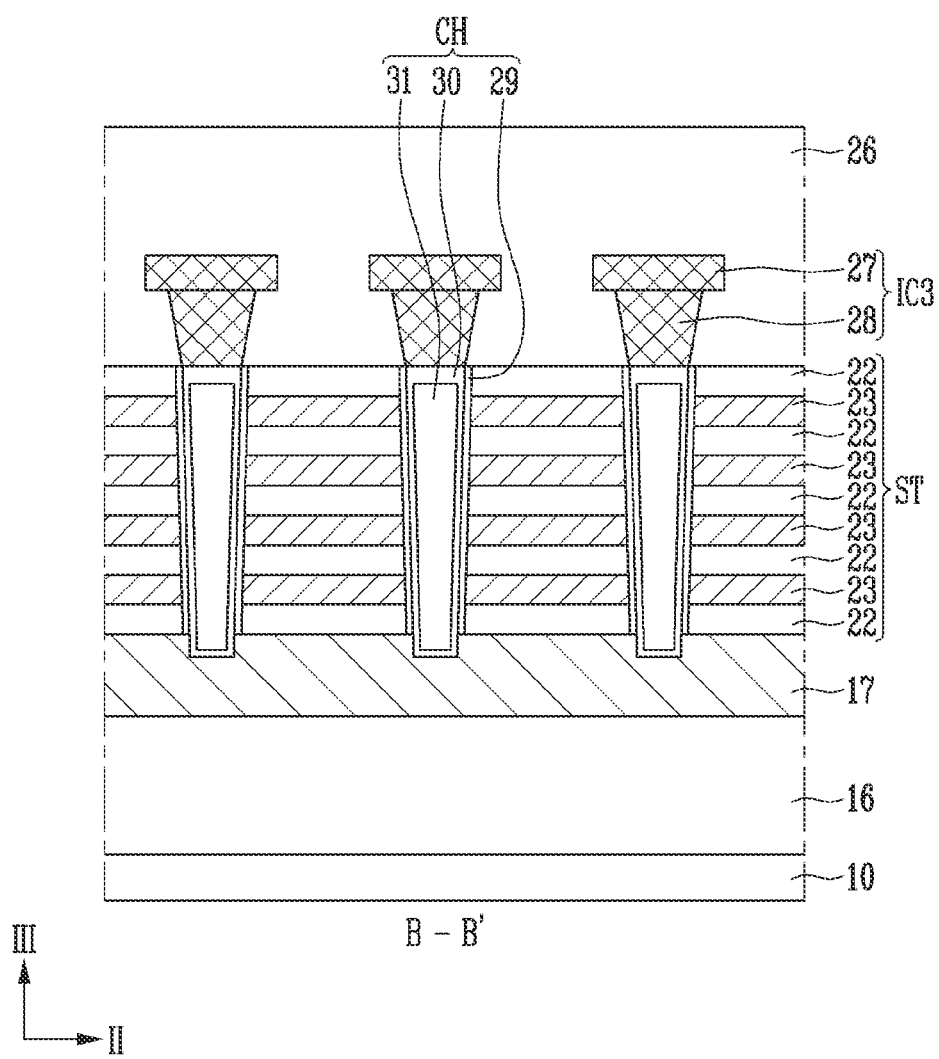

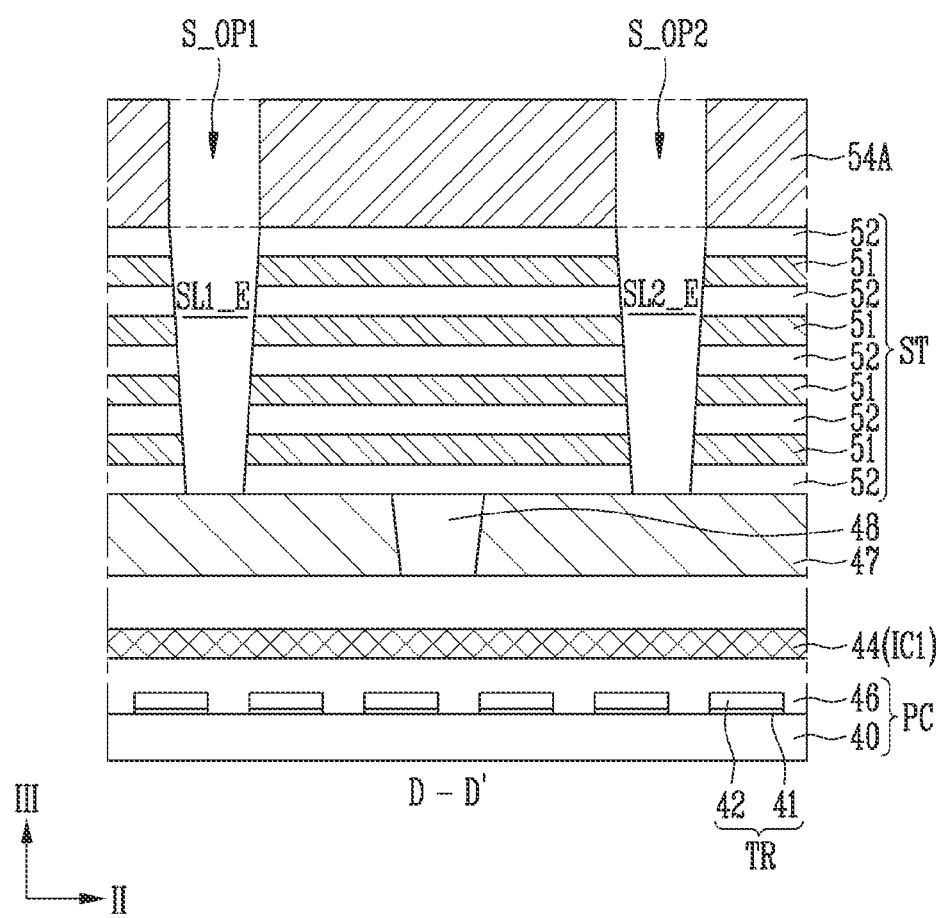

SEMICONDUCTOR DEVICE AND MANUFACTURING METHOD OF SEMICONDUCTOR DEVICE

CROSS-REFERENCE TO RELATED APPLICATION

The present application claims priority under 35 U.S.C. § 119(a) to Korean patent application number 10-2020-0093262 filed on Jul. 27, 2020, in the Korean Intellectual Property Office, the entire disclosure of which is incorporated by reference herein.

BACKGROUND

1. Technical Field

Various embodiments of the invention relate generally to an electronic device, and more particularly, to a semiconductor device and a method of manufacturing the semiconductor device.

2. Related Art

The degree of integration density of a semiconductor device may be generally determined by an area of a unit memory cell. However, the increase in integration density of the semiconductor device in which memory cells are formed in a single layer over a substrate has recently been limited. Thus, a three-dimensional semiconductor device has been proposed in which memory cells are stacked over a substrate. In addition, to improve the operational reliability of such semiconductor device, various structures and manufacturing methods have been developed.

SUMMARY

According to an embodiment, a method of manufacturing a semiconductor device may include forming a stacked structure with first material layers and second material layers that are stacked alternately with each other, forming a first slit that passes through the stacked structure, forming a second slit that passes through the stacked structure, forming a contact hole between the first slit and the second slit that passes through the stacked structure, forming a sealing layer that seals the first slit, the second slit and the contact hole, forming first openings that pass through the sealing layer and partially expose the first slit, forming a first slit insulating layer in first exposed regions and first sealing regions included in the first slit, the first exposed regions being portions of the first slit that are exposed through the first openings and the first sealing regions being portions of the first slit that are sealed by the sealing layer, etching the sealing layer to open the contact hole, and forming a first contact plug in the contact hole.

According to an embodiment, a method of manufacturing a semiconductor device may include forming a stacked structure with a cell region and a contact region, forming a channel structure that passes through the cell region of the stacked structure, forming a first slit that passes through the contact region of the stacked structure, forming a contact hole that passes through the contact region of the stacked structure, forming a sealing layer that seals the first slit and the contact hole, forming a mask pattern that partially exposes the first slit on the sealing layer, forming first openings that partially expose the first slit by etching the sealing layer using the mask pattern as an etch barrier, forming a first slit insulating layer in exposed regions and sealing regions included in the first slit, the exposed regions being portions of the first slit that are exposed through the first openings and the sealing regions being portions of the first slit that are sealed by the sealing layer, etching the sealing layer to open the contact hole, and forming a first contact plug in the contact hole.

BRIEF DESCRIPTION OF THE DRAWINGS

FIGS. 1A to 1C are diagrams, illustrating the structure of a semiconductor device, according to an embodiment of the present disclosure;

FIGS. 2A to 2C, FIGS. 3A to 3C, FIGS. 4A to 4C, FIGS. 5A to 5C, FIGS. 6A to 6C, FIGS. 7A to 7C, FIGS. 8A to 8C, FIGS. 9A to 9C, and FIGS. 10A to 10C are diagrams, illustrating a method of manufacturing a semiconductor device, according to an embodiment of the present disclosure;

DETAILED DESCRIPTION

Specific structural or functional descriptions of examples of embodiments in accordance with concepts which are disclosed in this specification are illustrated only to describe the examples of embodiments in accordance with the concepts and the examples of embodiments in accordance with the concepts may be carried out by various forms but the descriptions are not limited to the examples of embodiments described in this specification.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Various embodiments are directed to a semiconductor device with a stabilized structure and improved characteristics, and a method of manufacturing the semiconductor device.

Figure 1A:
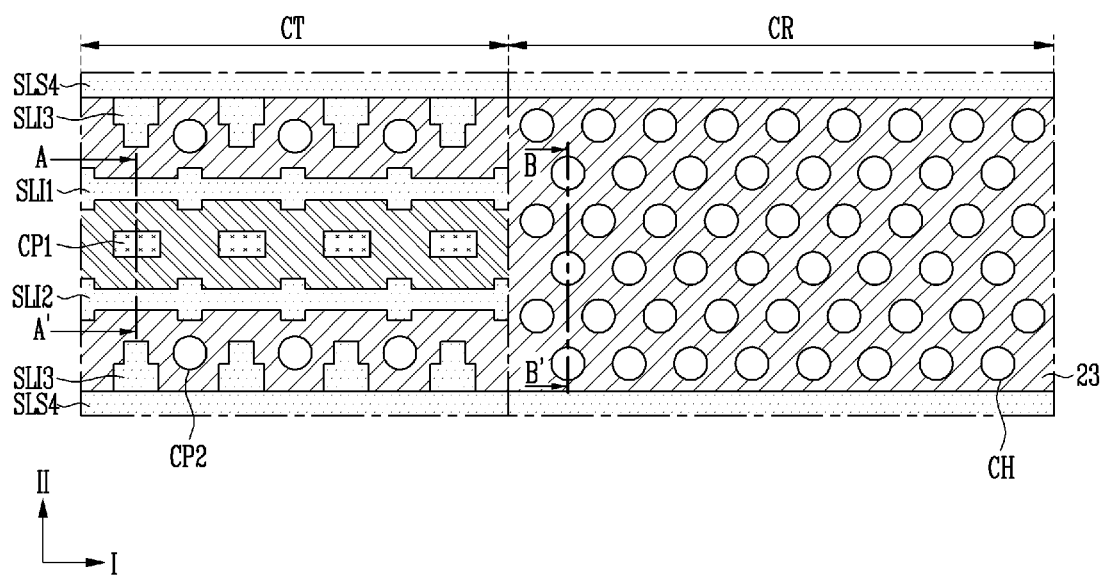
Figure 1B:
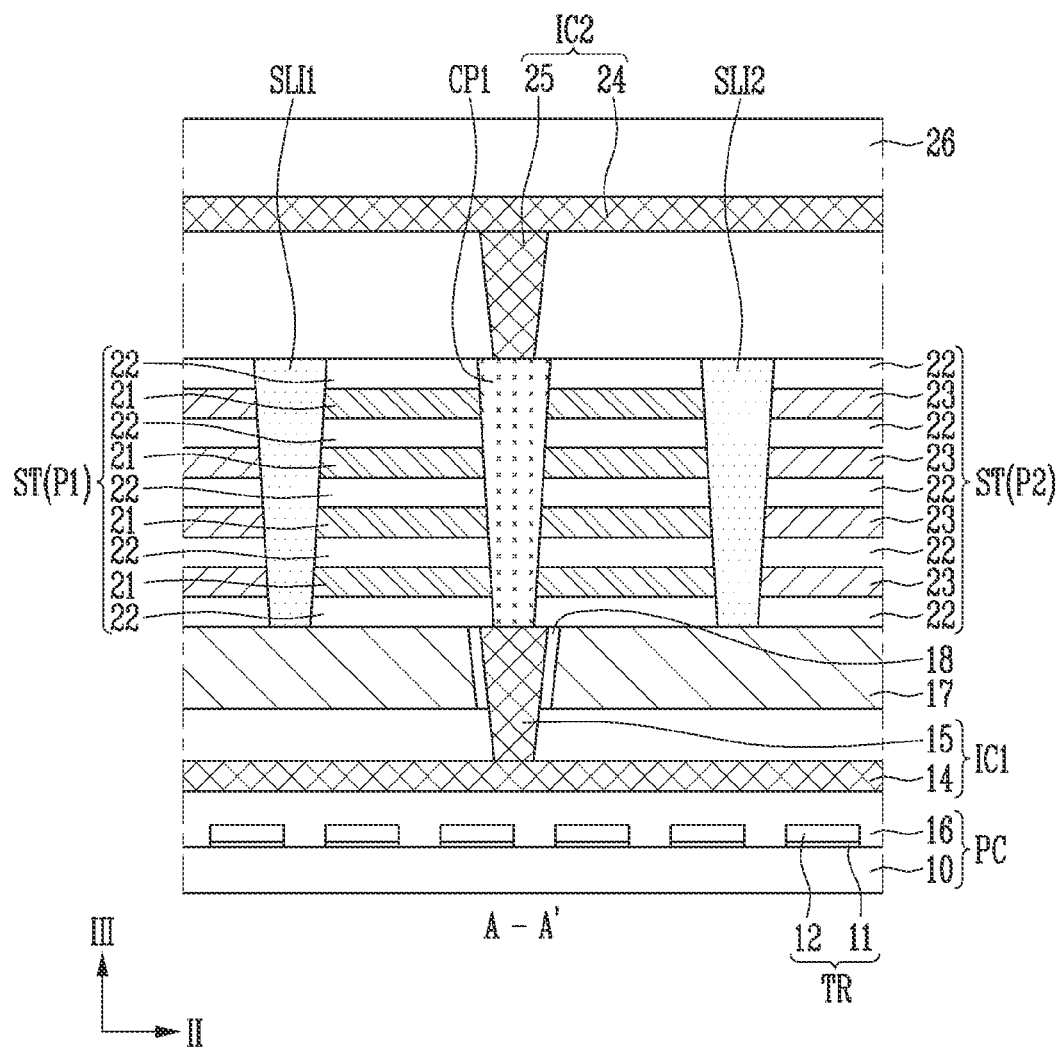

FIGS. 1A to 1C are diagrams, illustrating the structure of a semiconductor device, according to an embodiment of the present disclosure.

Referring to FIGS. 1A to 1C, a semiconductor device may include a stacked structure ST, a first slit insulating layer SLI1, a second slit insulating layer SLI2, and first contact plugs CP1. The semiconductor device may further include a third slit insulating layer SLI3, a fourth slit structure SLS4, a peripheral circuit PC, a first interconnection structure IC1, a source structure 17, a channel structure CH, a second interconnection structure IC2, a first interlayer insulating layer 16, a second interlayer insulating layer 26, a third interconnection structure IC3, or a combination thereof.

The stacked structure ST may include a cell region CR and a contact region CT. The cell region CR and the contact region CT may be adjacent to each other in a first direction I. According to an embodiment, the contact region CT may be located between a pair of cell regions CR. Alternatively, the cell region CR may be located between a pair of contact regions CT.

Memory cells may be stacked in the cell region CR. According to an embodiment, a memory cell string including at least one drain select transistor, memory cells and at least one source select transistor may be located in the cell region CR.

The cell region CR may include conductive layers 23 and insulating layers 22 that are stacked alternately with each other. Each of the conductive layers 23 may be a gate electrode of a memory cell or a select transistor. The conductive layers 23 may include polysilicon, metal such as tungsten (W) or molybdenum (Mo), or a combination thereof. At least one lowermost conductive layer 23 may be a source select line, at last one uppermost conducive layer 23 may be a drain select line, and the other conductive layers 23 may be word lines. The insulating layers 22 may insulate the conductive layers 23 from each other and may include an insulating material, such as oxide or an air gap.

The contact region CT may refer to a region in which pads that apply a bias to the conductive layers, respectively, are located. The contact region CT may have a stepped shape and expose each of the conductive layers 23. The exposed portions of the conductive layers 23 may serve as pads. Second contact plugs CP2 may be electrically coupled to the conductive layers 23, respectively.

The contact region CT may include a first portion P1 and a second portion P2. According to an embodiment, the first portion P1 may be located between neighboring second portions P2 in a second direction II. The second direction II may cross the first direction I. The second portion P2 may include the conductive layers 23 and the insulating layers 22 that are stacked alternately with each other. The conductive layers 23 in the cell region CR and the conductive layers 23 in the contact region CT may be coupled to each other. The insulating layers 22 in the cell region CR and the insulating layers 22 in the contact region CT may be coupled to each other.

The first portion P1 may include sacrificial layers 21 and the insulating layers 22 that are stacked alternately with each other. The sacrificial layers 21 may be residual layers that are not replaced by the conductive layers 23 during manufacturing processes. The sacrificial layers 21 may include a material with a high etch selectivity with respect to the insulating layers 22. According to an embodiment, the sacrificial layers 21 may include nitride and the insulating layers 22 may include oxide.

The first slit insulating layer SLI1 may be located in the contact region CT. The first slit insulating layer SLI1 may pass through the contact region CT of the stacked structure ST in a third direction III. The third direction III may cross the first direction I and the second direction II. According to an embodiment, the third direction III may protrude from the plane that is defined in the first direction I and the second direction II. The first slit insulating layer SLI1 may extend in the first direction I and may be located at the boundary between the first portion P1 and the second portion P2.

The second slit insulating layer SLI2 may be located in the contact region CT. The second slit insulating layer SLI2 may pass through the contact region CT of the stacked structure ST in the third direction III. The second slit insulating layer SLI2 may extend in the first direction I and may be located at the boundary between the first portion P1 and the second portion P2. The first slit insulating layer SLI1 and the second slit insulating layer SLI2 may be adjacent to each other in the second direction II.

The third slit insulating layer SLI3 may be located in the contact region CT. The third slit insulating layer SLI3 may pass through the contact region CT of the stacked structure ST in the third direction III. The third slit insulating layer SLI3 may be located in the second portion P2. In a plan view, the third slit insulating layer SLI3 may have a shape, such as a circle, an ellipse, or a polygon, or may have a T shape. The third slit insulating layers SLI3 may be located in the second portion P2 and the third slit insulating layers SLI3 may be arranged in the first direction I.

The fourth slit structure SLS4 may be located in the contact region CT. The fourth slit structure SLS4 may pass through the contact region CT of the stacked structure ST in the third direction III. The fourth slit structure SLS4 may extend in the first direction I and may be located in the second portion P2. The third slit insulating layer SLI3 may be located between the first slit insulating layer SLI1 and the fourth slit structure SLS4 or between the second slit insulating layer SLI2 and the fourth slit structure SLS4.

The fourth slit structure SLS4 may include an insulating material and may be considered a slit insulating layer. However, the fourth slit structure SLS4 may include a contact structure that is electrically coupled to the source structure 17 and an insulating spacer that surrounds a sidewall of the contact structure. The contact structure may include polysilicon, metal such as tungsten (W) or molybdenum (Mo), or a combination thereof.

Each of the first slit insulating layer SLI1, the second slit insulating layer SLI2, or the fourth slit structure SLS4 may have a linear shape that extends in the first direction I. The first slit insulating layer SLI1 may have a length in the first direction I and a width in the second direction II. The width of the first slit insulating layer SLI1 may vary based on the area thereof. The first slit insulating layer SLI1 may have a relatively small width at a portion that corresponds to the third slit insulating layer SLI3 or the first contact plug CP1. The first slit insulating layer SLI1 may have a relatively large width between the third slit insulating layers SLI3 or between the first contact plugs CP1. In the same manner as the first slit insulating layer SLI1, the width of the second slit insulating layer SLI2 may vary based on the area thereof.

The first contact plug CP1 may be located in the contact region CT. The first contact plug CP1 may pass through the contact region CT of the stacked structure ST in the third direction III. The first contact plug CP1 may be located between the first slit insulating layer SLI1 and the second slit insulating layer SLI2. The first contact plug CP1 may be located in the first portion P1. The first contact plugs CP1 may be located in the first portion P1 and may be arranged in the first direction I.

The channel structure CH may be located in the cell region CR. The channel structure CH may pass through the cell region CR of the stacked structure ST in the third direction III. The channel structure CH may include a channel layer 30 and may further include a memory layer 29 or a gap-filling insulating layer 31. The channel layer 30 may include a semiconductor material, such as silicon or germanium. The memory layer 29 may be interposed between the channel layer 30 and the conductive layers 23. The memory layer 29 may include at least one of a tunnel insulating layer, a data storage layer, and a blocking layer. The data storage layer may include a charge trap material, a floating gate, nitride, a variable resistance material, a phase change material, or a ferroelectric material. The channel structures CH may be arranged in the first direction I and the second direction II.

The source structure 17 may be located under the stacked structure ST. The source structure 17 may be provided to apply a source voltage and may have a single-layer structure or a multilayer structure. The source structure 17 may include polysilicon, metal such as tungsten (W) or molybdenum (Mo), or a combination thereof. The channel structures CH may be coupled to the source structure 17. The channel structure CH may protrude into the source structure 17 and may be directly coupled to the source structure 17. Alternatively, the channel structure CH and the source structure 17 may be coupled to each other through an epitaxially grown semiconductor layer.

The peripheral circuit PC may be located under the source structure 17. The peripheral circuit PC may include a circuit that drives a memory string, and an X-decoder. The peripheral circuit PC may include a transistor TR, a capacitor, a resistor, and the like. According to an embodiment, the transistor TR may include a gate electrode 12 that is formed on a substrate 10 and a gate insulating layer 11 interposed between the substrate 10 and the gate electrode 12. Though not shown, the transistor TR may further include a junction that is formed in the substrate 10, and an isolation layer may be formed in the substrate 10. The peripheral circuit PC may be located under the contact region CT, under the cell region CR, or under the contact region CT and the cell region CR.

The first interconnection structure IC1 may be electrically coupled to the peripheral circuit PC. The first interconnection structure IC1 may include first wires 14 or a third contact plug 15. The first wires 14 may be formed in the first interlayer insulating layer 16. The third contact plug 15 may pass through the source structure 17 and may be electrically coupled to the first wires 14. An insulating pattern 18 may be interposed between the third contact plug 15 and the source structure 17. The first contact plug CP1 may be electrically coupled to the third contact plug 15 and electrically coupled to the peripheral circuit PC through the first interconnection structure IC1.

The second interconnection structure IC2 may be located above the stacked structure ST. The second interconnection structure IC2 may include second wires 24 or a fourth contact plug 25. The second wires 24 or the fourth contact plug 25 may be formed in the second interlayer insulating layer 26. The fourth contact plug 25 may be electrically coupled to the first contact plug CP1.

The third interconnection structure IC3 may be located above the stacked structure ST. The third interconnection structure IC3 may include third wires 27 or a fifth contact plug 28. The third wires 27 or the fifth contact plug 28 may be formed in the second interlayer insulating layer 26. The third wires 27 may be located at a different level than the second wires 24 and may be electrically insulated from the second wires 24. The second wires 24 may be bit lines.

According to the above-described structure, the peripheral circuit PC may be located under the stacked structure ST, thereby improving the integration density of the semiconductor device. The contact region CT may be divided into a first portion P1 and a second portion P2 by the first slit insulating layer SLI1 and the second slit insulating layer SLI2. In addition, the first contact plug CP1 may pass through the first portion P1 and may be electrically coupled to the peripheral circuit PC.

FIGS. 2A to 2C, FIGS. 3A to 3C, FIGS. 4A to 4C, FIGS. 5A to 5C, FIGS. 6A to 6C, FIGS. 7A to 7C, FIGS. 8A to 8C, FIGS. 9A to 9C, and FIGS. 10A to 10C are diagrams, illustrating a method of manufacturing a semiconductor device, according to an embodiment of the present disclosure. FIGS. 2A to 10A are plan views. FIGS. 2B to 10B are C-C' cross-sectional views. FIGS. 2C to 10C are D-D' cross-sectional views. In the following description, description of certain elements that are discussed above is omitted for the sake of brevity.

Figure 2A:
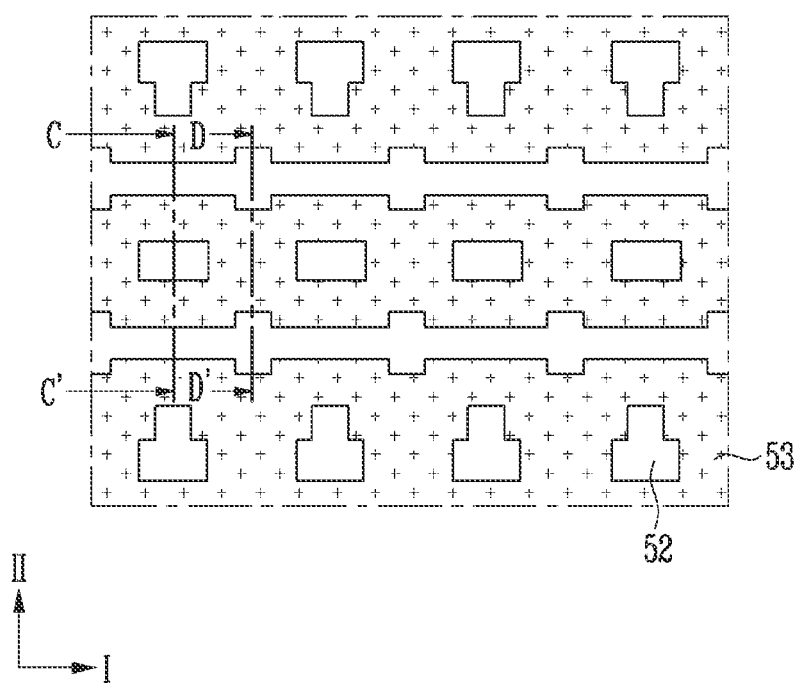
Figure 2B:
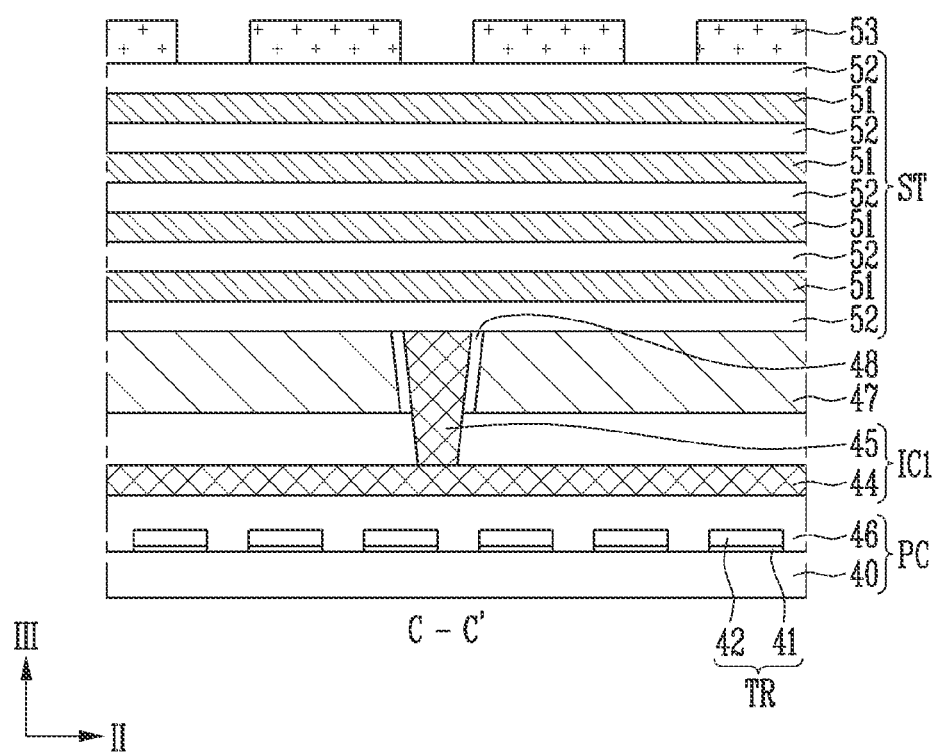
Figure 2C:
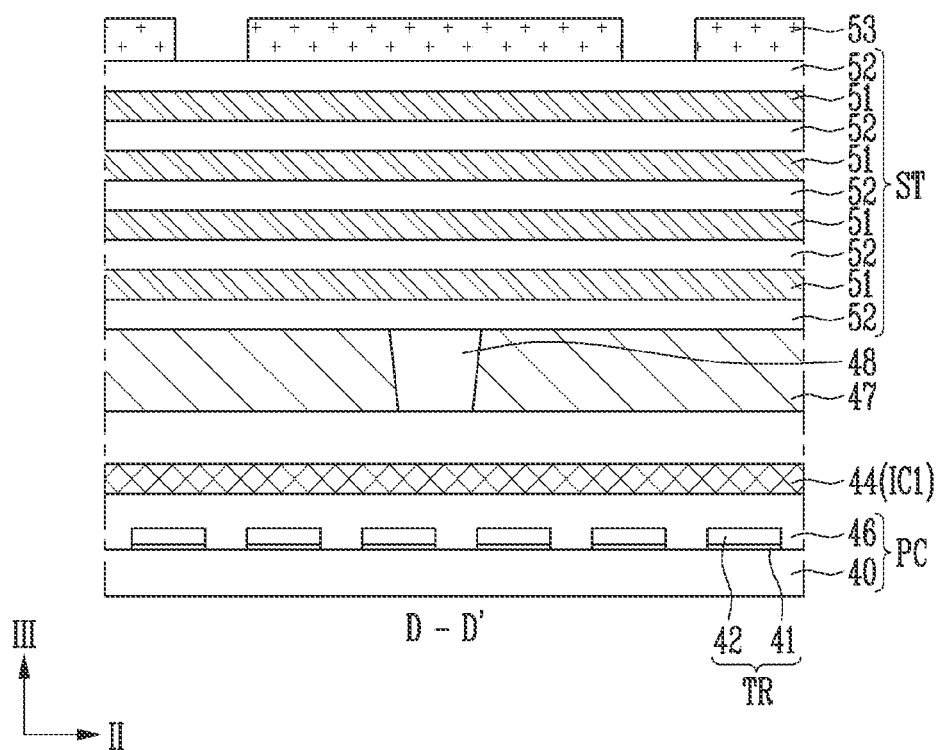

Referring to FIGS. 2A to 2C, the stacked structure ST may be formed on a lower structure. The lower structure may include the peripheral circuit PC. The peripheral circuit PC may include a base 40, and the base 40 may include a semiconductor substrate. The peripheral circuit PC may include the transistor TR. The transistor TR may include a gate insulating layer 41 and a gate electrode 42. The lower structure may include a first interconnection structure IC1 that is electrically coupled to the peripheral circuit PC. The first interconnection structure IC1 may be formed in a first interlayer insulating layer 46 and may include wires 44.

Before the stacked structure ST is formed, a source structure 47 may be formed on the first interlayer insulating layer 46. The source structure 47 may include a single layer or a plurality of layers. The source structure 47 may include a sacrificial layer. A contact plug 45 and an insulating pattern 48 may be formed through the source structure 47. The contact plug 45 may be part of the first interconnection structure IC1 and may be electrically coupled to the wires 44.

The stacked structure ST may include first material layers 51 and second material layers 52 that are alternately stacked. The first material layers 51 may include a material with a high etch selectivity with respect to the second material layers 52. For example, the first material layers 51 may include a sacrificial material, such as nitride, and the second material layers 52 may include an insulating material, such as oxide. For example, the first material layers 51 may include a conductive material, such as polysilicon, tungsten, or molybdenum, and the second material layers 52 may include an insulating material, such as oxide.

FIGS. 2A to 2C mainly illustrate a contact region of the stacked structure ST. However, the stacked structure ST may further include a cell region. After the stacked structure ST is formed, a channel structure may be formed through the cell region of the stacked structure ST. When the source structure 47 includes a sacrificial layer, a process of replacing the sacrificial layer with a source layer may be performed. In addition, the contact region may be patterned to expose each of the first material layers 51. According to an embodiment, after the contact region is patterned into a step shape, an interlayer insulating layer may be formed.

A first mask pattern 53 may then be formed on the stacked structure ST. The first mask pattern 53 may be a hard mask pattern. The first mask pattern 53 may include nitride, a carbon-based material, or a combination thereof.

Figure 3A:
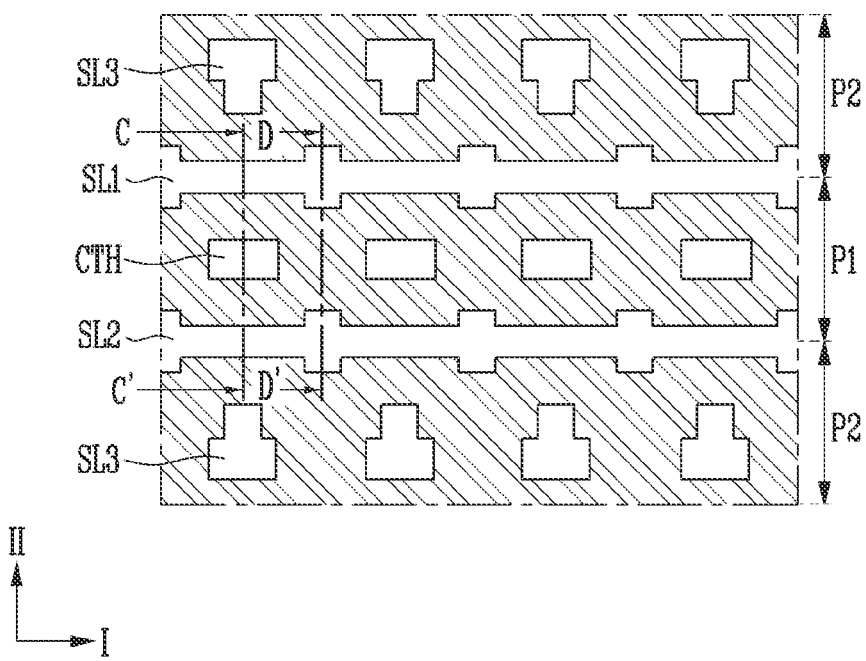
Figure 3B:
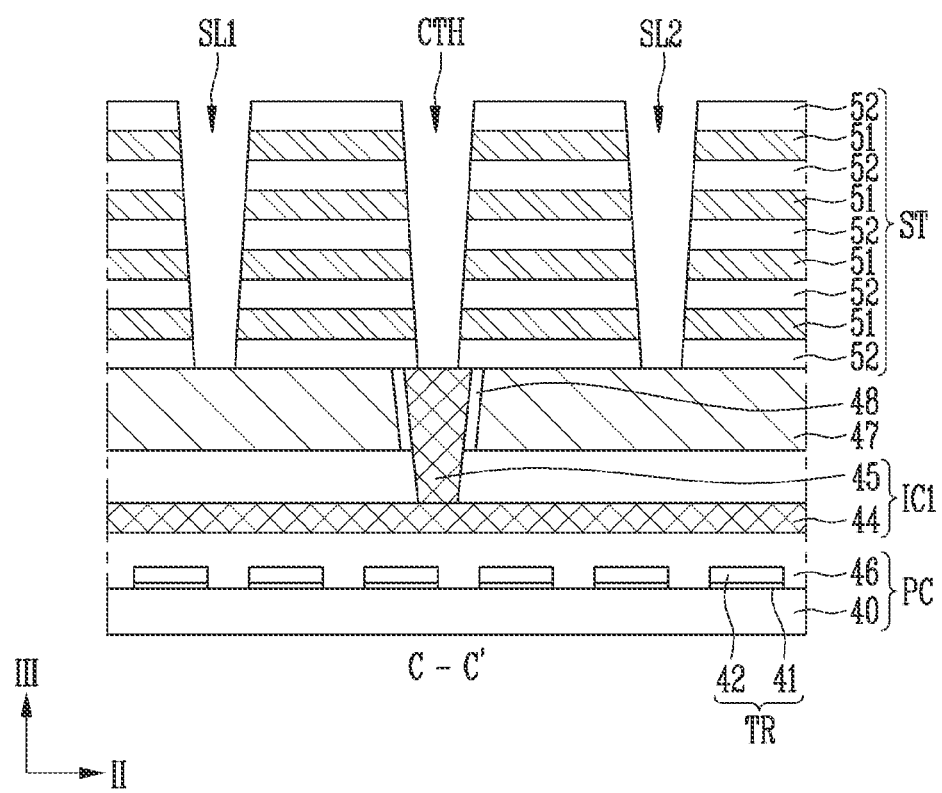
Figure 3C:
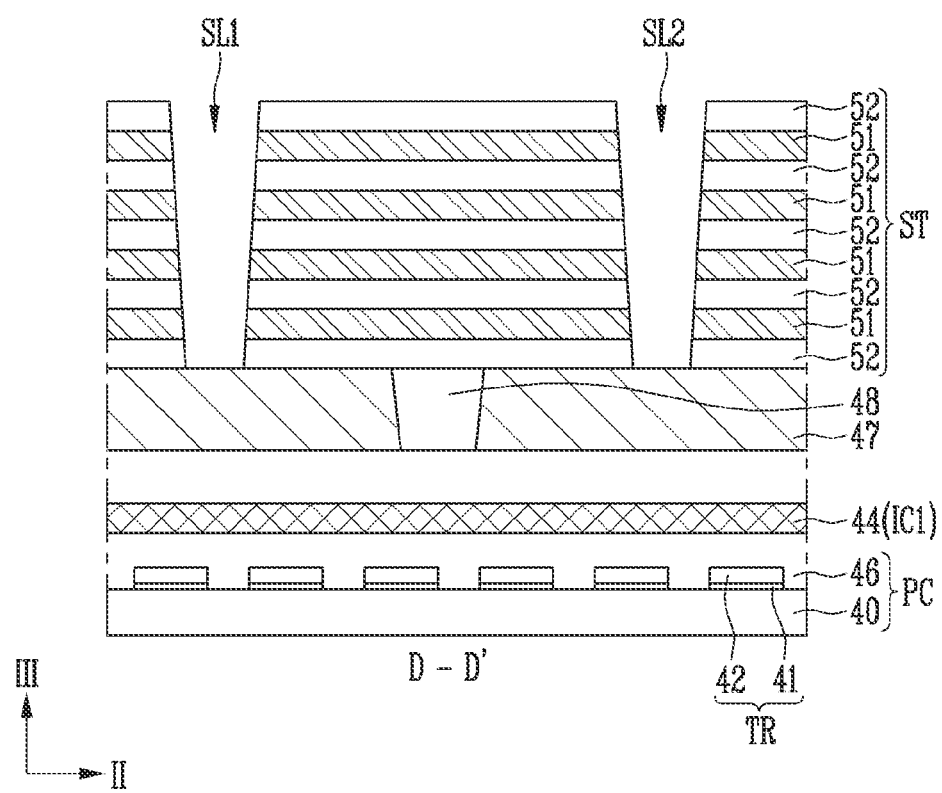

Referring to FIGS. 3A to 3C, a first slit SL1 may be formed through the stacked structure ST. A second slit SL2 may be further formed through the stacked structure ST, a contact hole CTH may be formed through the stacked structure ST, or a third slit SL3 may be formed through the stacked structure ST. The second slit SL2, the contact hole CTH, or the third slit SL3 may be formed when the first slit SL1 is formed. According to an embodiment, the first slit SL1, the second slit SL2, the contact hole CTH, and the third slit SL3 may be formed by etching the stacked structure ST by using the first mask pattern 53 as an etch barrier. The first slit SL1, the second slit SL2, or the third slit SL3 may be deep enough to expose the source structure 47. The contact hole CTH may be formed to a specific depth in order to expose the contact plug 45. The third slit SL3, the first slit SL1, the contact hole CTH and the second slit SL2 may be adjacent to each other in the second direction II.

The stacked structure ST may include the first portion P1 that is defined between the first slit SL1 and the second slit SL2 and the second portion P2 that is located in areas other than areas between the first slit SL1 and the second slit SL2. The first portion P1 may be located between neighboring second portions P2 that oppose each other in the second direction II. The second portion P2 may be located outside of the area between the first slit SL1 and the second slit SL2. The first portion P1 and the second portions P2 may be separated from each other by the first slit SL1 and the second slit SL2. In addition, the first portion P1 of the stacked structure ST may have a high aspect ratio.

Figure 4A:
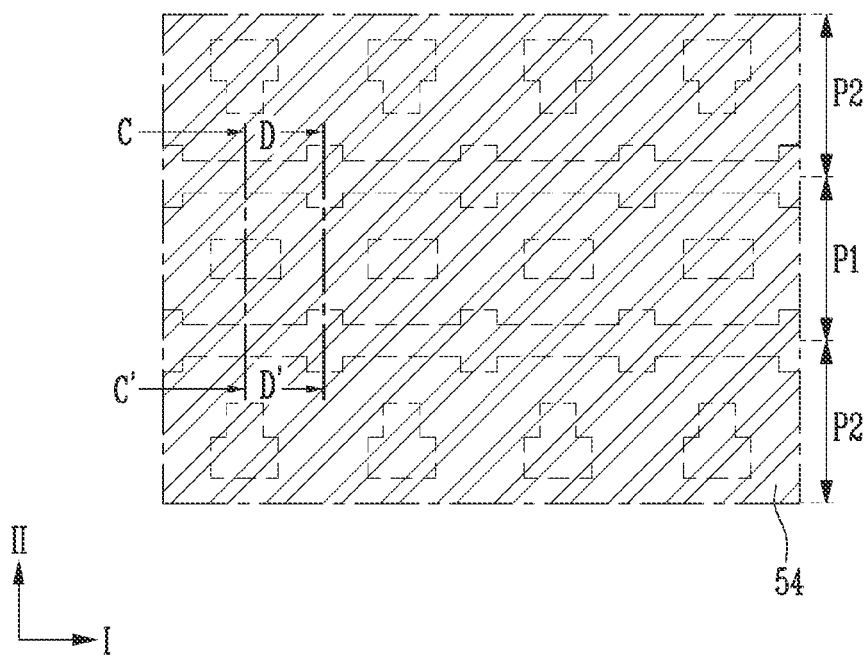
Figure 4B:
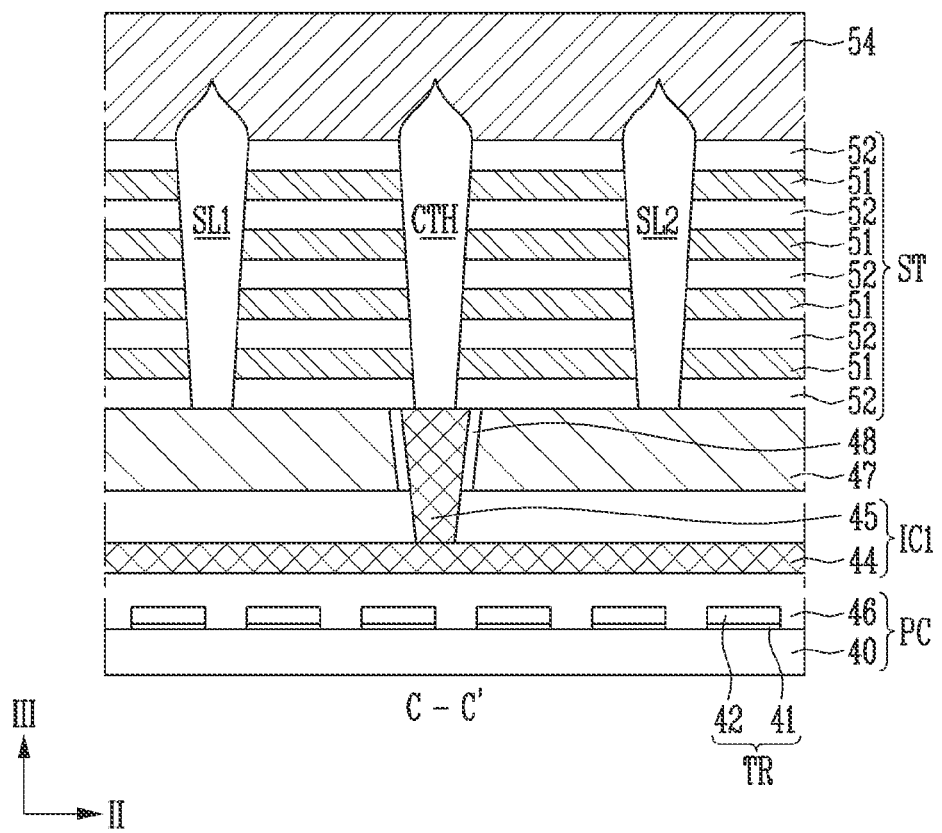
Figure 4C:
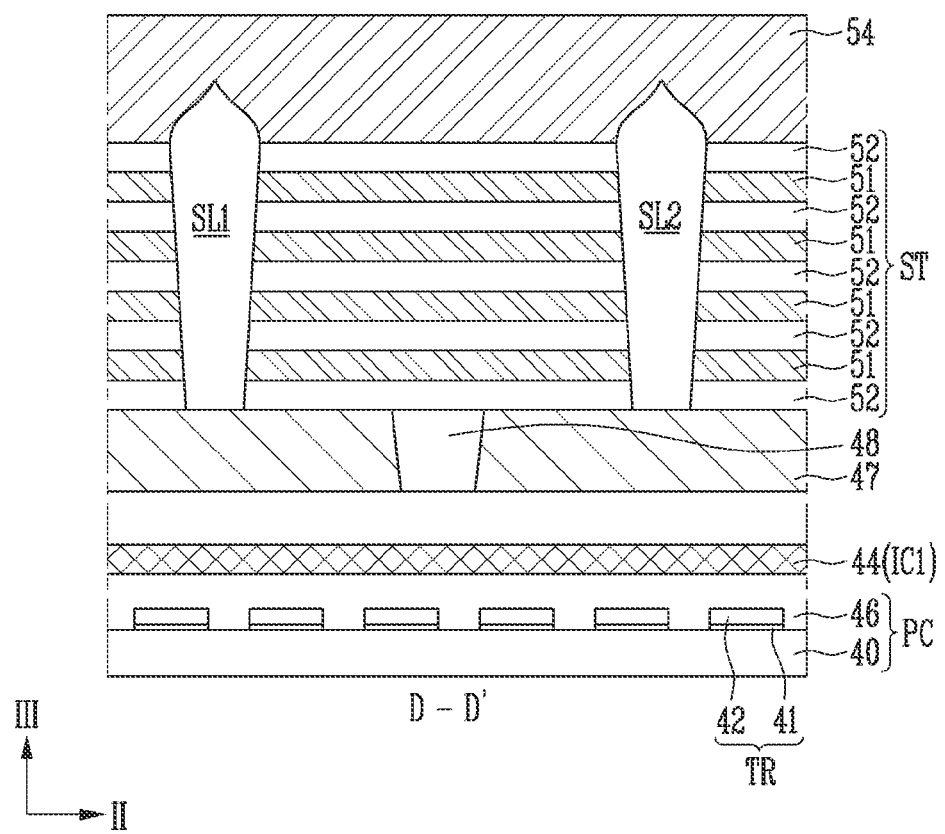

Referring to FIGS. 4A to 4C, a sealing layer 54 may be formed. The sealing layer 54 may be formed to seal the first slit SL1, the contact hole CTH and the second slit SL2. The sealing layer 54 may be formed by using a material with poor step coverage. The sealing layer 54 may include a silicon compound. According to an embodiment, the sealing layer 54 may include tetraethyl orthosilicate (TEOS), Undoped Silicate Glass (USG).

Inlets of the first slit SL1, the contact hole CTH, and the second slit SL2 may be sealed by the sealing layer 54, and the insides thereof may remain empty. According to an embodiment, portions of upper sides of the first slit SL1, the contact hole CTH, and the second slit SL2 may be filled, and the other portions thereof may remain empty. Therefore, the inclination or bending of the first portion P1 or the second portion P2 of the stacked structure ST in the second direction II may be minimized or prevented.

Figure 5A:
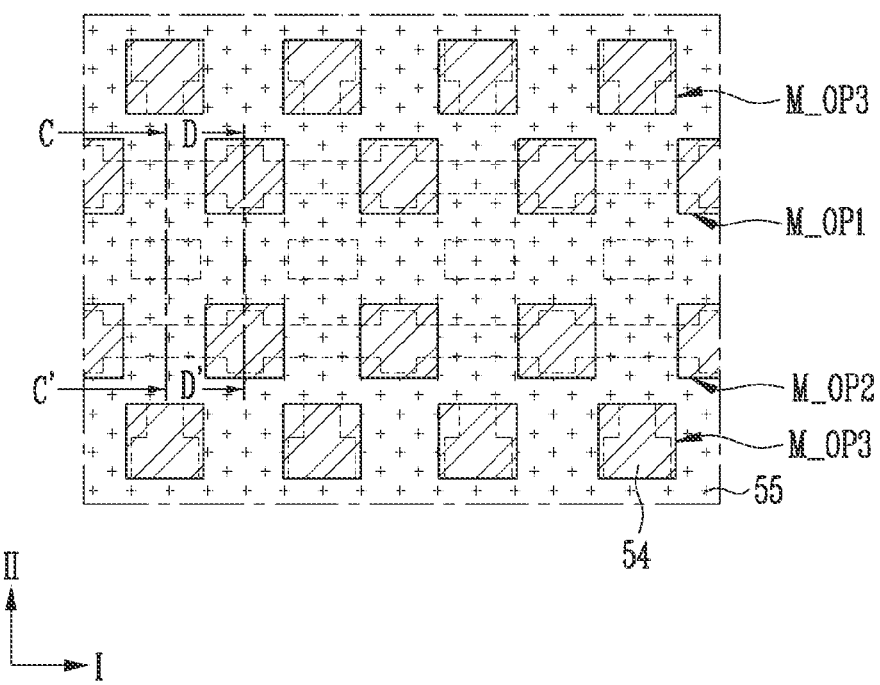
Figure 5B:
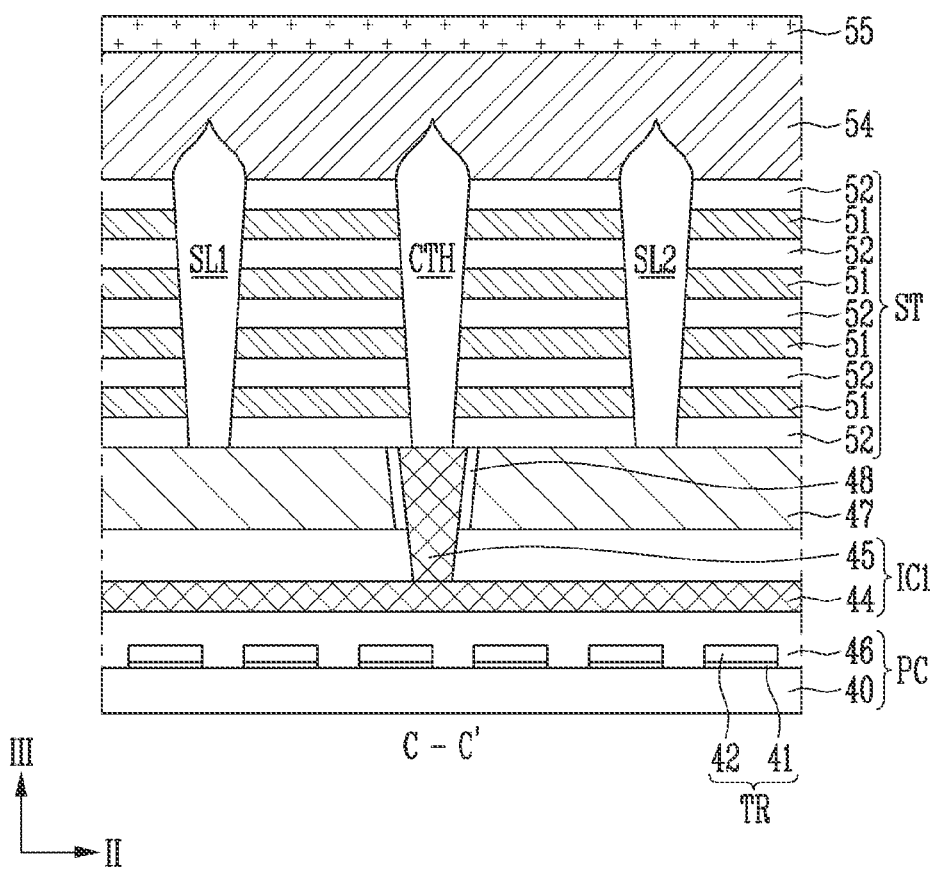
Figure 5C:
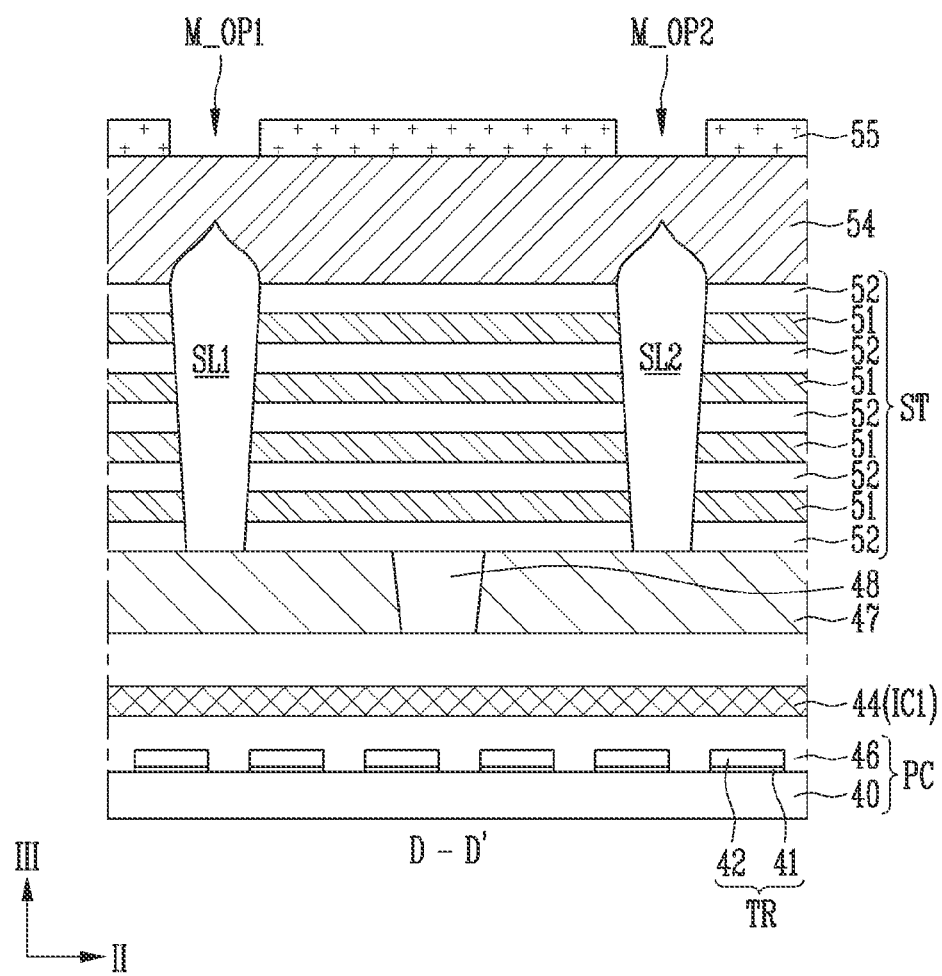

Referring to FIGS. 5A to 5C, a second mask pattern 55 may be formed on the sealing layer 54. The second mask pattern 55 may be a hard mask pattern. The second mask pattern 55 may include nitride, a carbon-based material, or a combination thereof. The second mask pattern 55 may be formed to partially expose the first slit SL1 and may cover the contact holes CTH.

The second mask pattern 55 may include first openings M_OP1 that partially expose the first slit SL1. The first openings M_OP1 may expose a portion of the first slit SL1 that has a relatively large width.

The second mask pattern 55 may further include second openings M_OP2 that partially expose the second slit SL2. The second openings M_OP2 may expose a portion of the second slit SL2 that has a relatively large width. The second openings M_OP2 may be formed when the first openings M_OP1 are formed.

The second mask pattern 55 may further include third openings M_OP3 that partially expose the third slit SL3. The third openings M_OP3 may expose the third slits SL3, respectively. However, one third opening M_OP3 may expose a plurality of third slits SL3. The third openings M_OP3 and the first openings M_OP1 may be arranged in a staggered manner to avoid any overlap in the second direction II. The third openings M_OP3 may be formed when the first openings M_OP1 are formed.

Figure 6A:
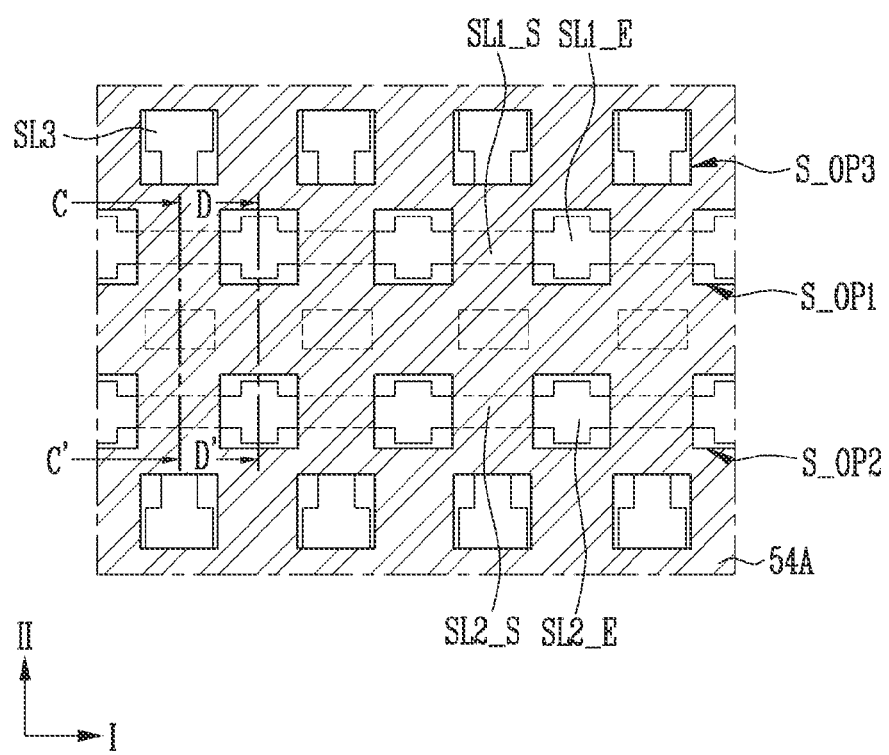
Figure 6B:
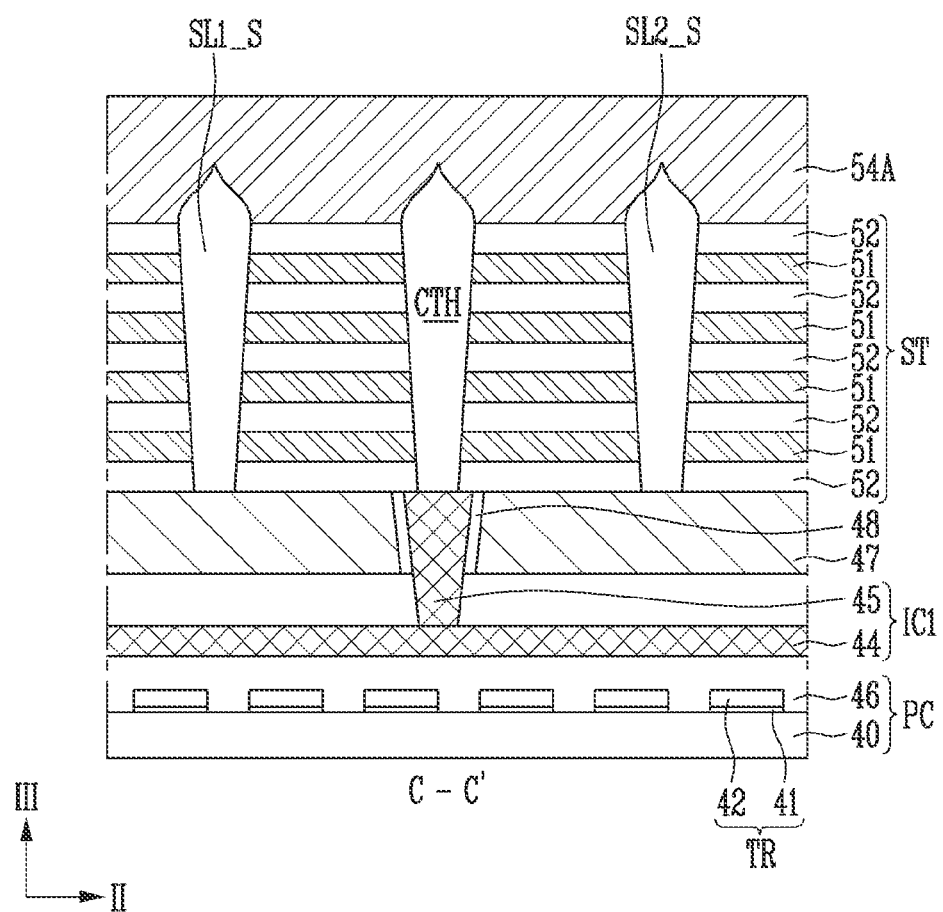

Referring to FIGS. 6A to 6C, first openings S_OP1 that pass through the sealing layer 54 and partially expose the first slit SL1 may be formed. According to an embodiment, a sealing layer 54A with the first openings S_OP1 may be formed by etching the sealing layer 54 by using the second mask pattern 55 as an etch barrier. Second openings S_OP2 that pass through the sealing layer 54 and partially expose the second slit SL2 may be further formed. Third openings S_OP3 that pass through the sealing layer 54 and partially expose the third slits SL3 may be further formed.

The first slit SL1 may include exposed regions SL1_E that are exposed through the first openings S_OP1 and sealing regions SL1_S that are sealed by the sealing layer 54A. The second slit SL2 may include exposed regions SL2_E that are exposed through the second openings S_OP2 and sealing regions SL2_S that are sealed by the sealing layer 54A. The third slits SL3 may be exposed through the third openings S_OP3.

The sealing layer 54A may partially expose the first slit SL1. The sealing layer 54A may seal the first slit SL1 between the first openings S_OP1 to successively cover the first portion P1 and the second portion P2. Therefore, the first slit SL1 may be re-opened while the first portion P1 and the second portion P2 of the stacked structure ST are supported by the sealing layer 54A. As a result, the inclination or bending of the first portion P1 or the second portion P2 of the stacked structure ST may be minimized or prevented.

Figure 7A:
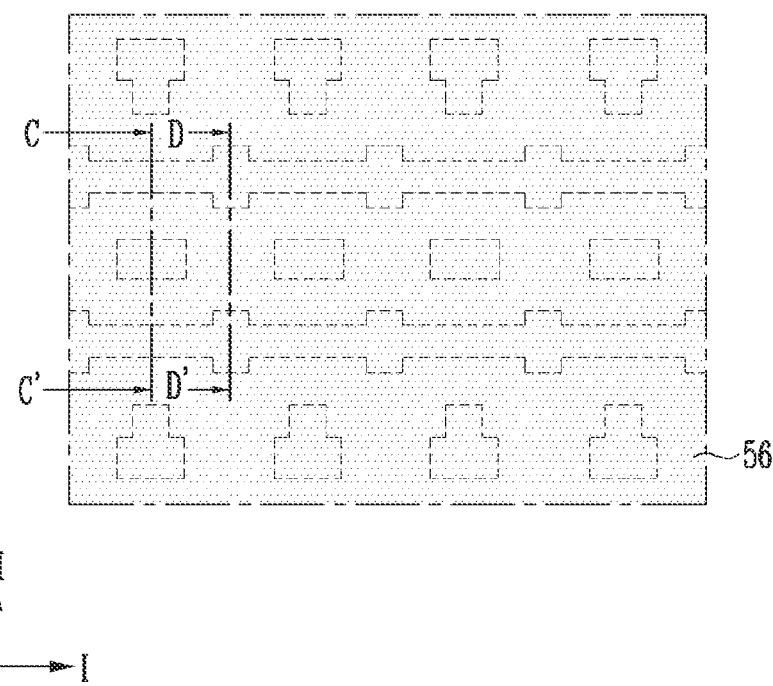
Figure 7B:
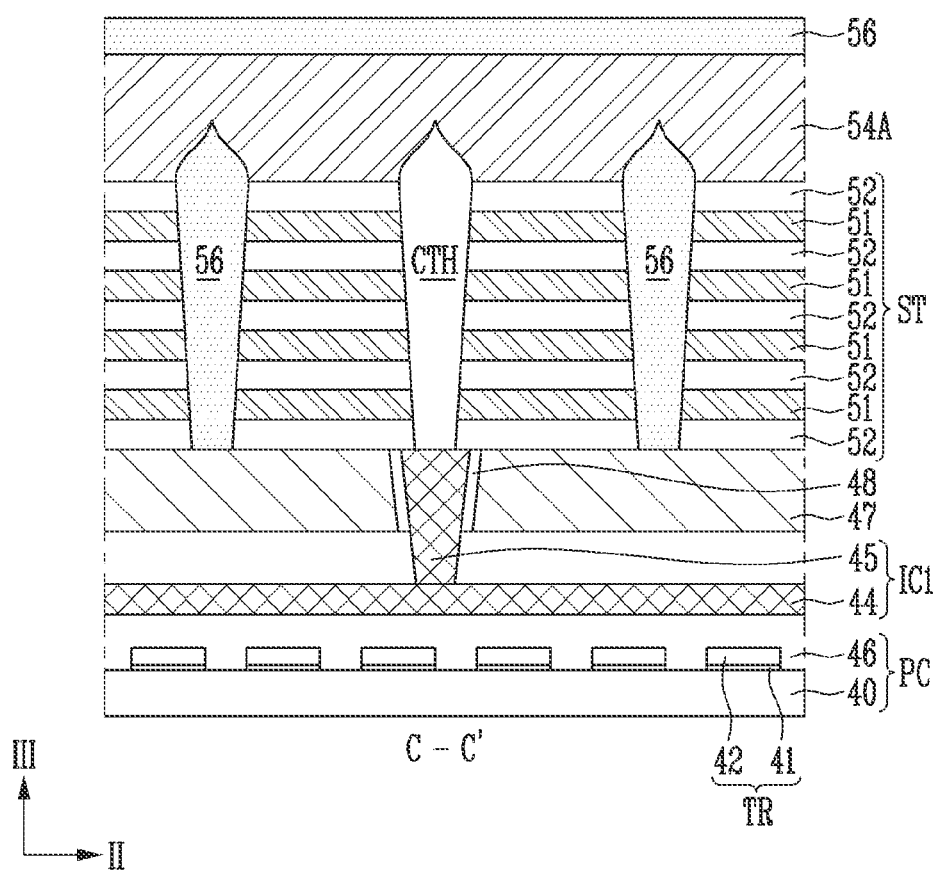
Figure 7C:
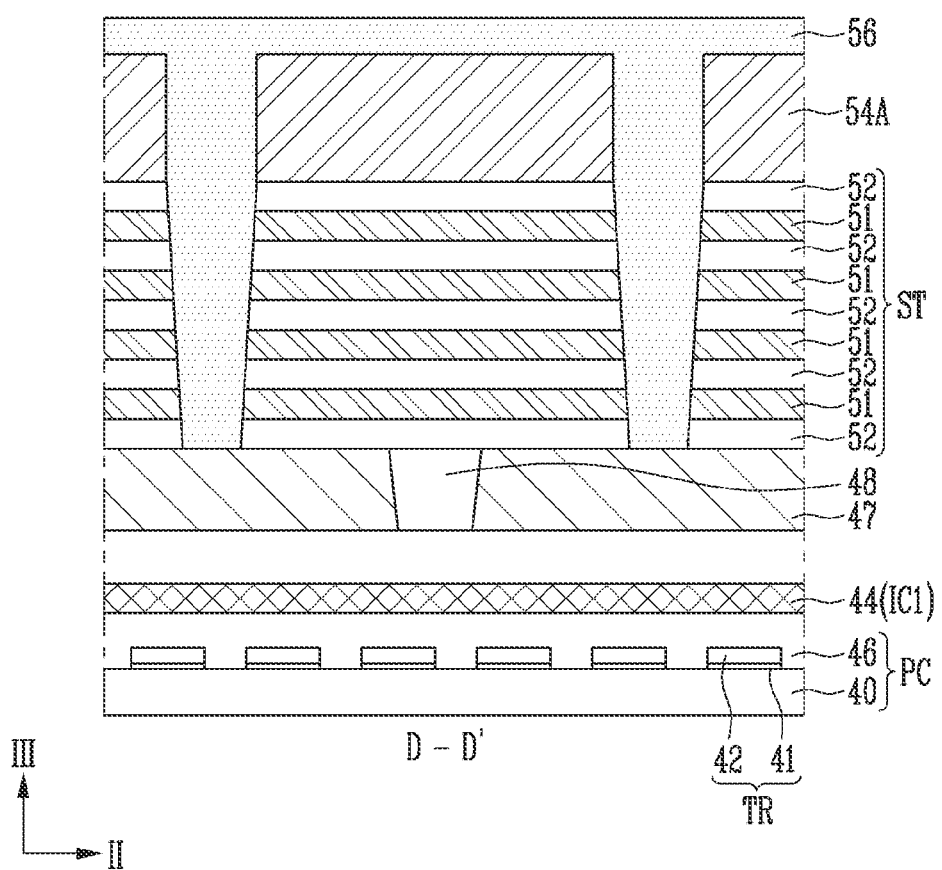

Referring to FIGS. 7A to 7C, an insulating layer 56 may be formed. The insulating layer 56 may include an insulating material, such as oxide. According to an embodiment, after an insulating material layer is formed by using a deposition process, the insulating material layer may be planarized to form the insulating layer 56. The insulating layer 56 may be formed in the first slit SL1 and the sealing regions SL1_S, as well as the exposed regions SL1_E. The insulating layer 56 may be formed in the sealing regions SL1_S through the first openings S_OP1 and the exposed regions SL1_E. Although the sealing regions SL1_S are not directly exposed, an insulating material may be introduced into and deposited on the sealing regions SL1_S through the exposed regions SL1_E. Therefore, the insulating layer 56 may also be formed in the sealing regions SL1_S.

The insulating layer 56 may be formed in the second slit SL2. The insulating layer 56 may be formed in the exposed region SL2_E and the sealing region SL2_S. The insulating layer 56 may be formed in the sealing regions SL2_S through the second openings S_OP2 and the exposed regions SL2_E. The insulating layer 56 may be formed in the third slits SL3. Through the third openings S_OP3, the insulating layer 56 may be formed in the third slits SL3.

Figure 8A:
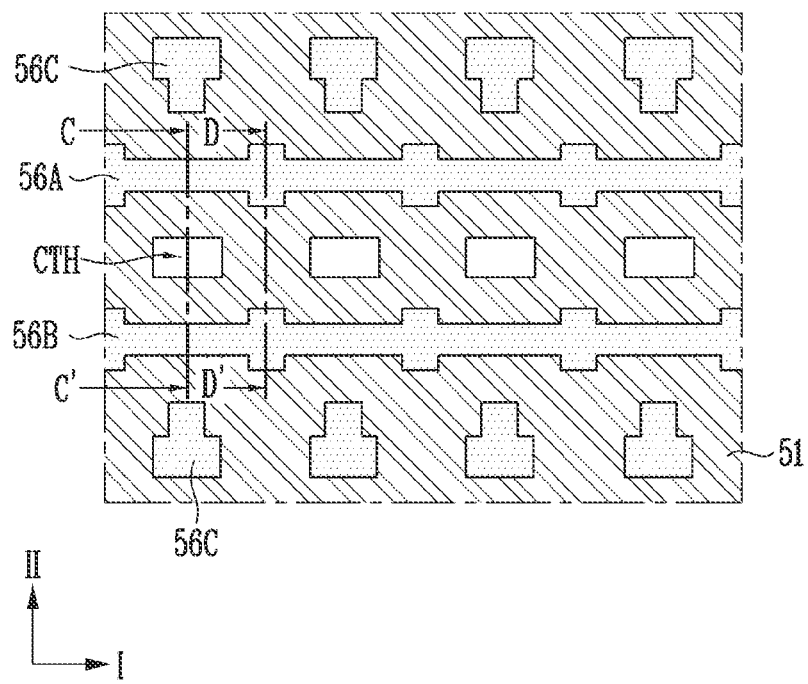
Figure 8B:
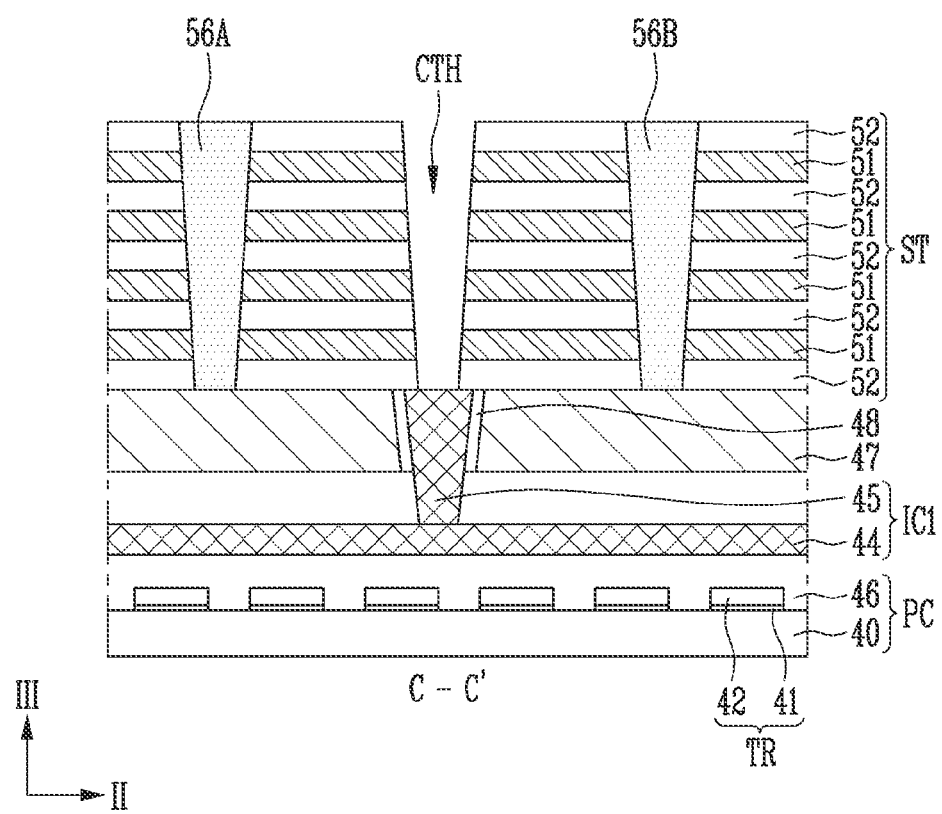
Figure 8C:
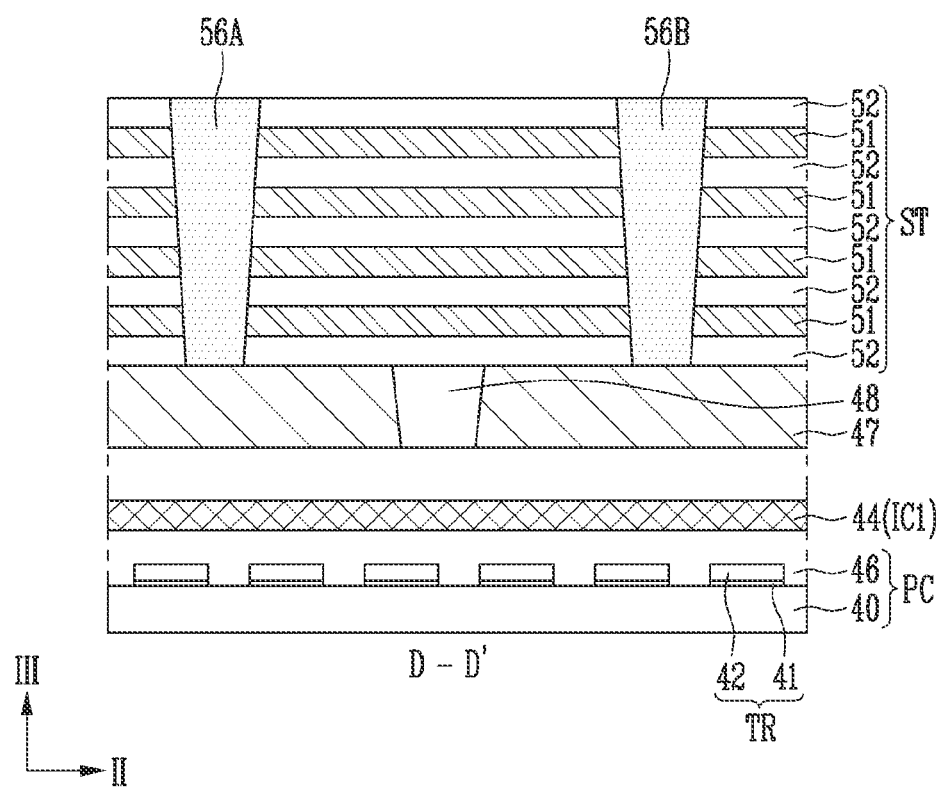

Referring to FIGS. 8A to 8C, the contact hole CTH may be opened. The contact hole CTH may be re-opened by etching the insulating layer 56 and the sealing layer 54A. The insulating layer 56 and the sealing layer 54A may be etched without a mask pattern. According to an embodiment, the insulating layer 56 and the sealing layer 54A may be etched by using an etch-back process. As a result, a first slit insulating layer 56A may be formed in the first slit SL1. A second slit insulating layer 56B may be formed in the second slit SL2. A third slit insulating layer 56C may be formed in the third slits SL3. The second slit insulating layer 56B may be formed when the first slit insulating layer 56A is formed. The third slit insulating layer 56C may be formed when the first slit insulating layer 56A is formed.

When the contact hole CTH is not formed during the manufacturing processes as described with reference to FIGS. 3A to 3C, the contact hole CTH may be formed by etching the stacked structure ST at the current stage.

Figure 9A:
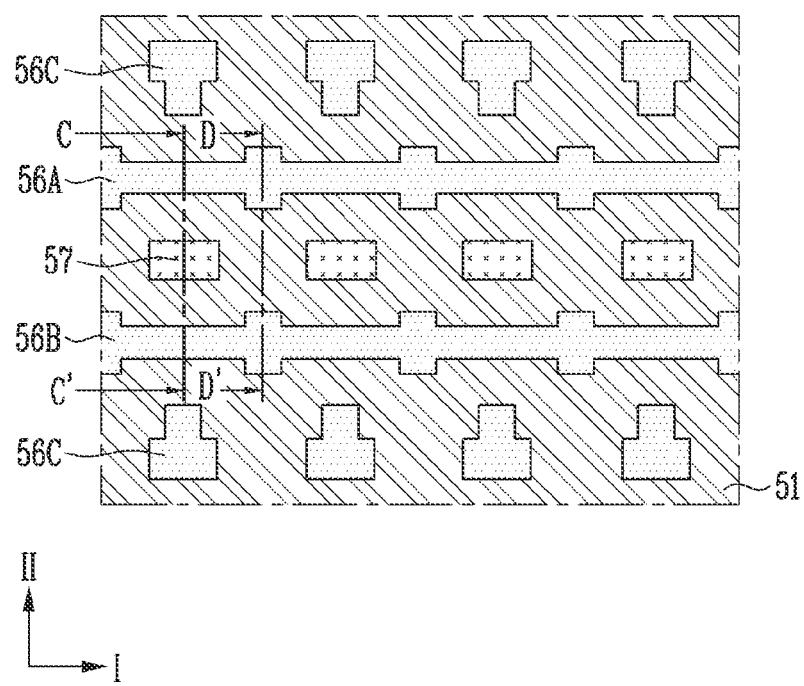
Figure 9B:
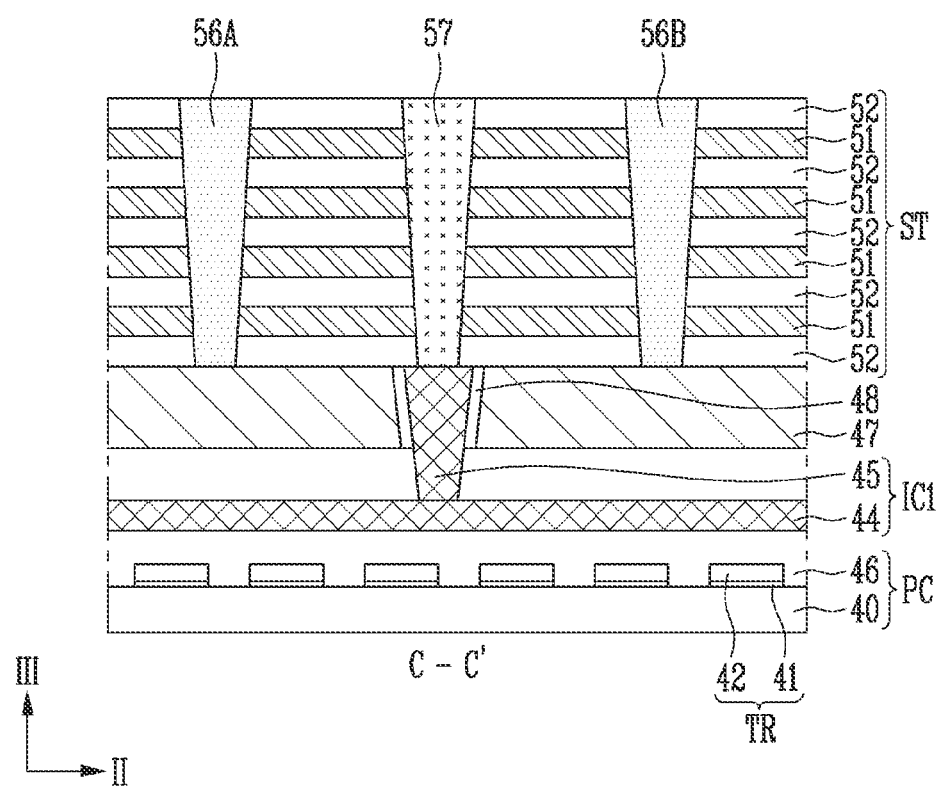
Figure 9C:
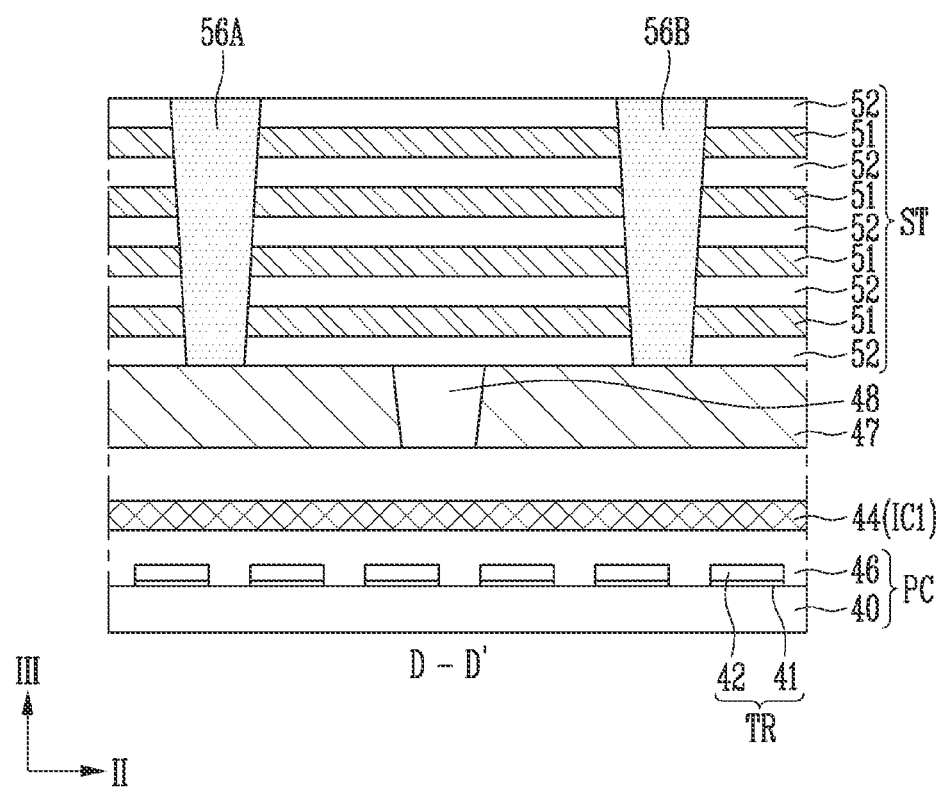

Referring to FIGS. 9A to 9C, a first contact plug 57 may be formed in the contact hole CTH. After a conductive material is deposited to fill the contact hole CTH, the conductive material may be planarized until the top surface of the stacked structure ST is exposed, so that the first contact plug 57 may be formed. The first contact plug 57 may include polysilicon, metal such as tungsten (W) or molybdenum (Mo), or a combination thereof.

Figure 10A:
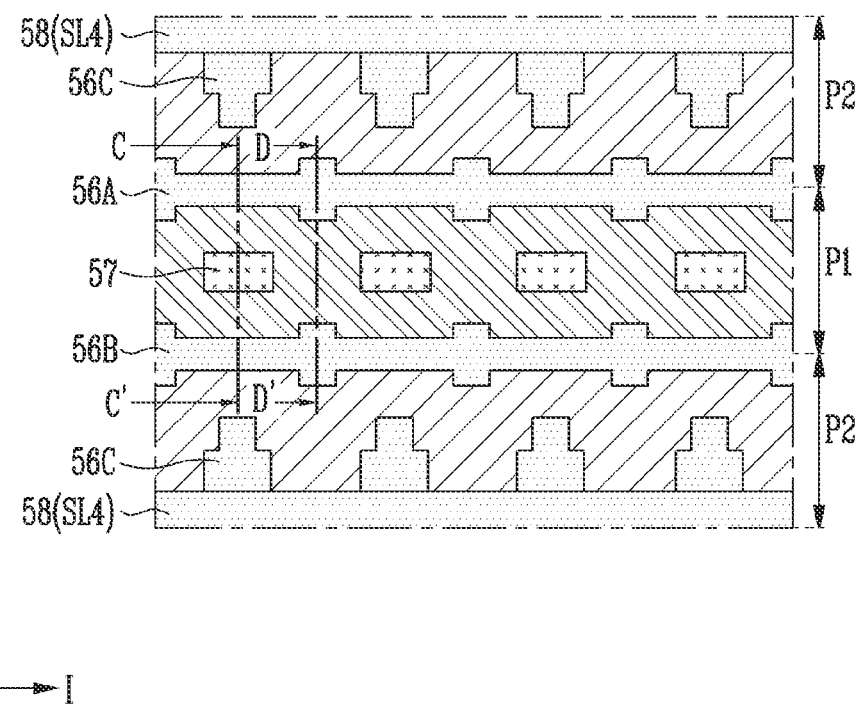
Figure 10B:
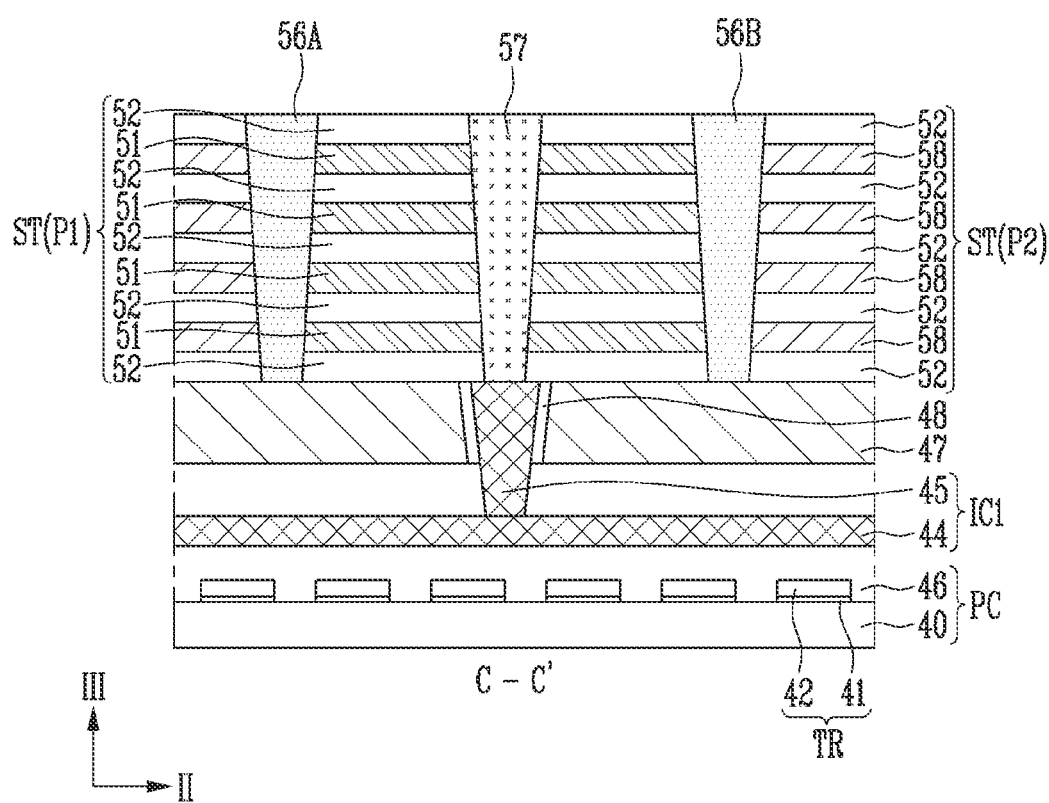
Figure 10C:
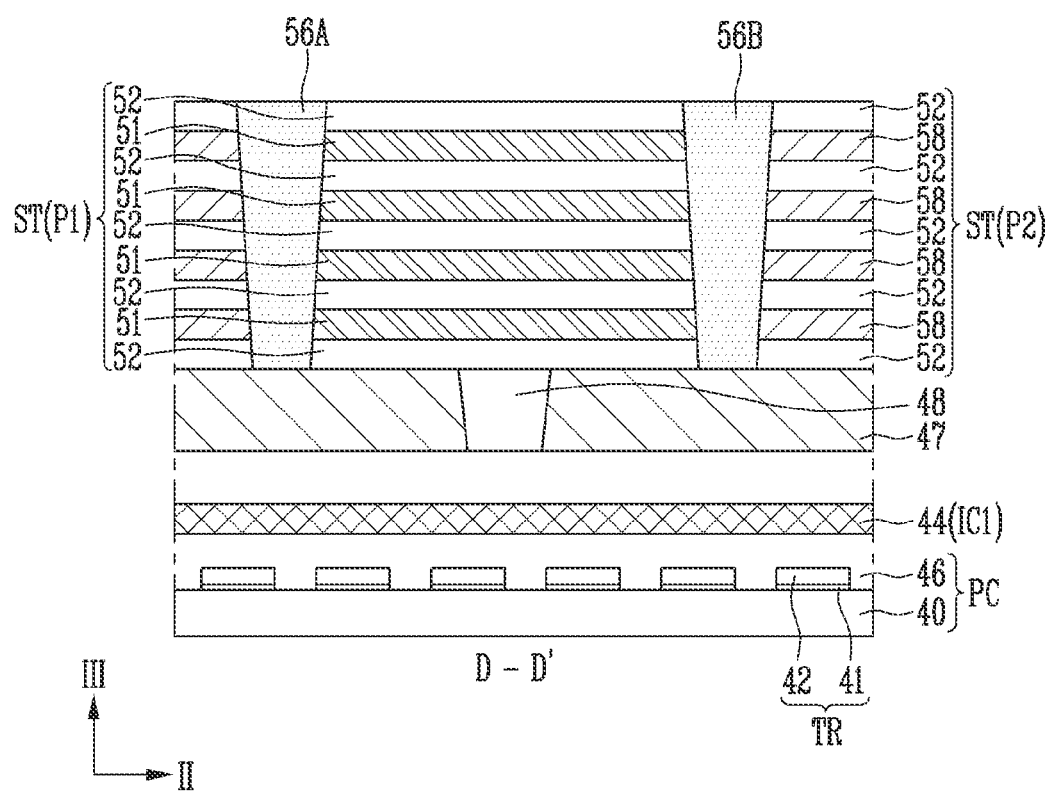

Referring to FIGS. 10A to 10C, a fourth slit SL4 that is located in the second portion P2 may be formed. The fourth slit SL4 may have a specific depth in order to expose the first material layers 51. The third slit insulating layers 56C may be located between the fourth slit SL4 and the first slit insulating layer 56A. The third slit insulating layers 56C may be located between the fourth slit SL4 and the second slit insulating layer 56B.

Subsequently, openings OP may be formed by selectively etching the first material layers 51 through the fourth slits SL4. The first portion P1 and the second portion P2 may be separated from each other by the first slit insulating layer 56A and the second slit insulating layer 56B. Therefore, the first material layers 51 in the second portion P2 may be selectively etched. On the other hand, the first material layers 51 in the first portion P1 may remain without being etched. The second material layers 52 that remain in the second portion P2 may be supported by the first slit insulating layer 56A, the second slit insulating layer 56B, or the third slit insulating layer 56C.

Conductive layers 58 may be formed in the openings OP. According to an embodiment, after a conductive material layer is deposited in the openings OP and the fourth slit SL4, the conductive material layer may be etched to form the conductive layers 58 that are separated from each other. As a result, the first material layers 51 may be replaced by the conductive layers 58.

Though not shown, second contact plugs that are coupled to the conductive layers 58 may be formed. A third interconnection structure that is coupled to a channel structure may be formed. A second interconnection structure that is electrically coupled to the first contact plug 57 may be formed.

According to the above-described manufacturing method, the contact region of the stacked structure ST may be divided into the first portion P1 and the second portion P2 by using the first slit insulating layer 56A and the second slit insulating layer 56B. In addition, by supporting the first portion P1 and the second portion P2 of the stacked structure ST by using the sealing layer 54A, the inclination or bending of the stacked structure ST may be minimized or prevented during manufacturing processes.

Figure 11:
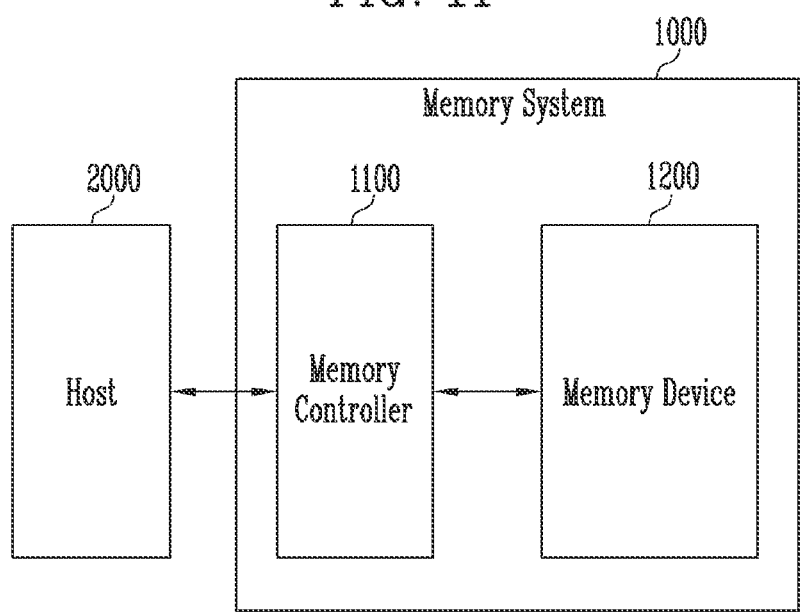
FIG. 11 is a diagram, illustrating a memory system, according to an embodiment of the present disclosure.

FIG. 11 is a diagram, illustrating a memory system 1000, according to an embodiment of the present disclosure.

Referring to FIG. 11, the memory system 1000 may include a memory device 1200 that is configured to store data and a controller 1100 performing communications between the memory device 1200 and a host 2000.

The host 2000 may be a device or system that is configured to store data in the memory system 1000 or retrieve data from the memory system 1000. The host 2000 may generate requests for various operations and output the generated requests to the memory system 1000. The requests may include a program request for a program operation, a read request for a read operation, and an erase request for an erase operation. The host 2000 may communicate with the memory system 1000 by using at least one interface protocol among Peripheral Component Interconnect Express (PCIe), Advanced Technology Attachment (ATA), Serial ATA (SATA), Parallel ATA (PATA), Serial Attached SCSI (SAS), Non-Volatile Memory express (NVMe), Universal Serial Bus (USB), Multi-Media Card (MMC), Enhanced Small Disk Interface (ESDI), and Integrated Drive Electronics (IDE).

The host 2000 may include at least one of a computer, a portable digital device, a tablet, a digital camera, a digital audio player, a television, a wireless communication device, or a cellular phone. However, embodiments of the disclosed technology are not limited thereto.

The controller 1100 may control overall operations of the memory system 1000. The controller 1100 may control the memory device 1200 in response to the requests of the host 2000. The controller 1100 may control the memory device 1200 to perform a program operation, a read operation and an erase operation at the request of the host 2000. Alternatively, the controller 1100 may perform a background operation for performance improvement of the memory system 1000 in the absence of the request from the host 2000.

To control the operations of the memory device 1200, the controller 1100 may transfer a control signal and a data signal to the memory device 1200. The control signal and the data signal may be transferred to the memory device 1200 through different input/output lines. The data signal may include a command, an address, or data. The control signal may be used to differentiate periods in which the data signal is input.

The memory device 1200 may perform a program operation, a read operation and an erase operation in response to control of the controller 1100. The memory device 1200 may be a volatile memory that loses data when power supply is blocked, or a non-volatile memory that retains data in the absence of power supply. According to an embodiment, the memory device 1200 may be the above-described semiconductor device, or a flash memory device.

At the request for a program, read, or erase operation from the host 2000, the controller 1100 may command the memory device 1200 that has the structure as described above with reference to FIGS. 1A to 1C, or manufactured by the method as described with reference to FIGS. 2A to 10C to perform a program, read, or erase operation. In this manner, cell performance characteristics and retention characteristics may be improved.

Figure 12:
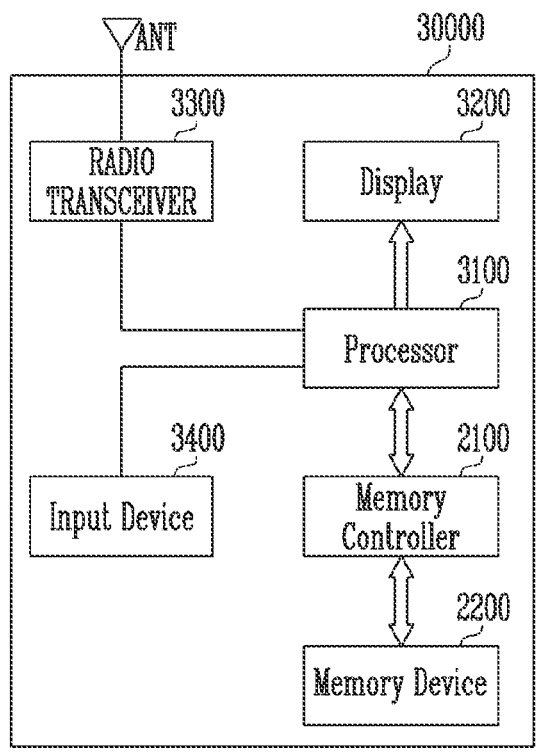
FIG. 12 is a diagram, illustrating a memory system, according to an embodiment of the present disclosure.

FIG. 12 is a diagram, illustrating a memory system 30000, according to an embodiment of the present disclosure.

Referring to FIG. 12, the memory system 30000 may be embodied into a cellular phone, a smart phone, a tablet, a personal computer (PC), a personal digital assistant (PDA), or a wireless communication device. The memory system 30000 may include a memory device 2200 and a controller 2100 controlling the operations of the memory device 2200.

The controller 2100 may control a data access operation of the memory device 2200, for example, a program operation, an erase operation or a read operation of the memory device 2200 in response to control of a processor 3100.

The data programmed into the memory device 2200 may be output through a display 3200 in response to control of the controller 2100.

A radio transceiver 3300 may exchange a radio signal through an antenna ANT. For example, the radio transceiver 3300 may change the radio signal received through the antenna ANT into a signal that can be processed by the processor 3100. Therefore, the processor 3100 may process the signal output from the radio transceiver 3300 and transfer the processed signal to the controller 2100 or the display 3200. The controller 2100 may transfer the signal processed by the processor 3100 into the memory device

2200. In addition, the radio transceiver 3300 may change a signal output from the processor 3100 into a radio signal and output the radio signal to an external device through the antenna ANT. A control signal for controlling the operations of the host or data to be processed by the processor 3100 may be input by an input device 3400, and the input device 3400 may include a pointing device, such as a touch pad and a computer mouse, a keypad, or a keyboard. The processor 3100 may control the operations of the display 3200 so that data output from the controller 2100, data output from the radio transceiver 3300, or data output from an input device 3400 may be output through the display 3200.

According to an embodiment, the controller 2100 capable of controlling the operations of the memory device 2200 may be realized as a portion of the processor 3100, or as a separate chip from the processor 3100.

Figure 13:
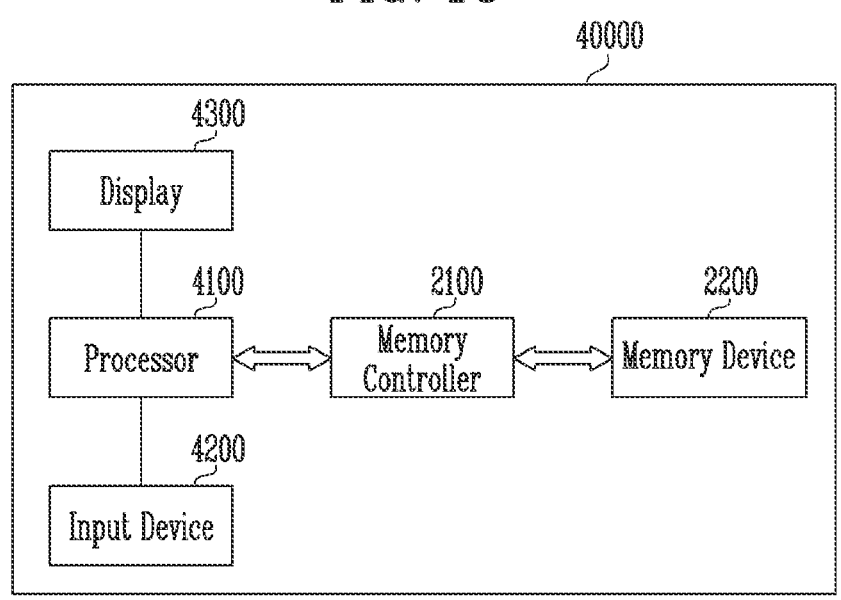
FIG. 13 is a diagram, illustrating a memory system, according to an embodiment of the present disclosure.

FIG. 13 is a diagram, illustrating a memory system 40000, according to an embodiment of the present disclosure.

Referring to FIG. 13, the memory system 40000 may be embodied into a personal computer (PC), a tablet PC, a net-book, an e-reader, a personal digital assistant (PDA), a portable multimedia player (PMP), an MP3 player, or an MP4 player.

The memory system 40000 may include the memory device 2200 and the controller 2100 controlling a data processing operation of the memory device 2200.

A processor 4100 may output data stored in the memory device 2200 through a display 4300 according to data input through an input device 4200. Examples of the input device 4200 may include a pointing device, such as a touch pad or a computer mouse, a keypad, or a keyboard.

The processor 4100 may control overall operations of the memory system 40000 and control operations of the controller 2100. According to an embodiment, the controller 2100 capable of controlling the operations of the memory device 2200 may be realized as a portion of the processor 4100, or as a separate chip from the processor 4100.

Figure 14:
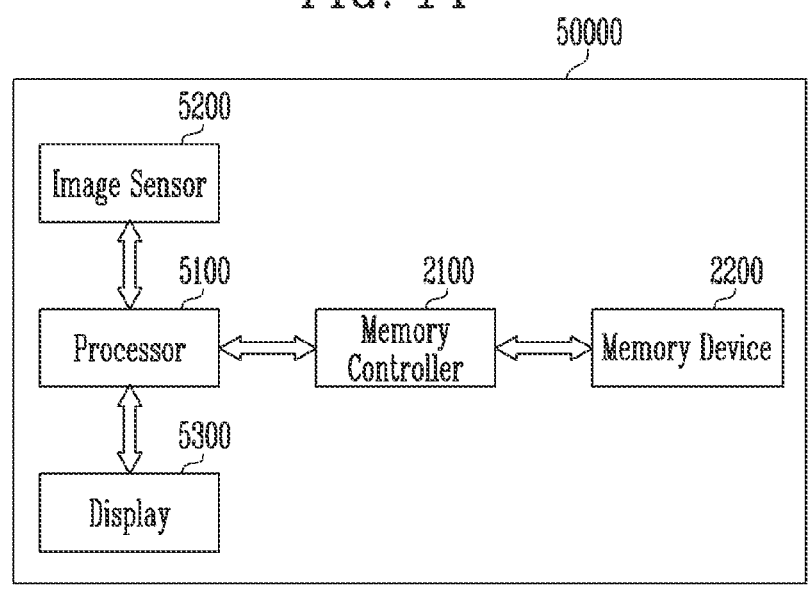
FIG. 14 is a diagram, illustrating a memory system, according to an embodiment of the present disclosure.

FIG. 14 is a diagram, illustrating a memory system 50000, according to an embodiment of the present disclosure.

Referring to FIG. 14, the memory system 50000 may be embodied into an image processor, for example, a digital camera, a cellular phone with a digital camera attached thereto, a smart phone with a digital camera attached thereto, or a tablet PC with a digital camera attached thereto.

The memory system 50000 may include the memory device 2200 and the controller 2100 controlling a data processing operation of the memory device 2200, for example, a program operation, an erase operation, or a read operation.

An image sensor 5200 of the memory system 50000 may convert an optical image into digital signals. The converted digital signals may be transferred to a processor 5100 or the controller 2100. In response to control of the processor 5100, the converted digital signals may be output through a display 5300 or stored in the memory device 2200 through the controller 2100. In addition, the data stored in the memory device 2200 may be output through the display 5300 in response to control of the processor 5100 or the controller 2100.

According to an embodiment, the controller 2100 capable of controlling the operations of the memory device 2200 may be formed as a part of the processor 5100, or a separate chip from the processor 5100.

Figure 15:
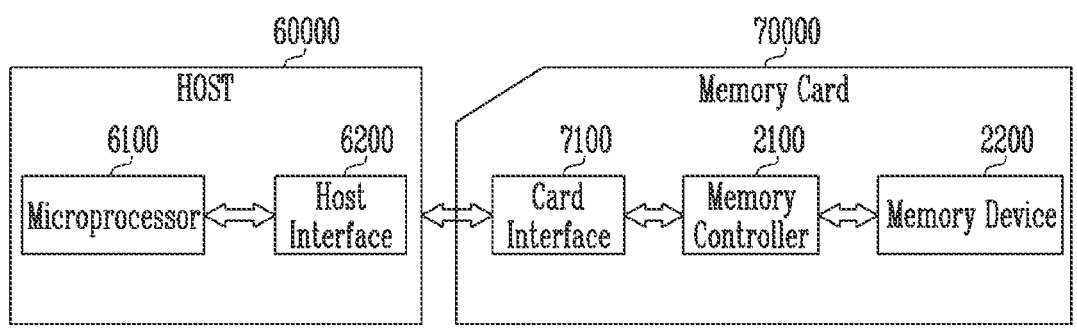
FIG. 15 is a diagram, illustrating a memory system, according to an embodiment of the present disclosure.

FIG. 15 is a diagram, illustrating a memory system 70000, according to an embodiment of the present disclosure.

Referring to FIG. 15, the memory system 70000 may include a memory card or a smart card. The memory system 70000 may include the memory device 2200, the controller 2100, and a card interface 7100.

The controller 2100 may control data exchange between the memory device 2200 and the card interface 7100. According to an embodiment, the card interface 7100 may be, but not limited thereto, a secure digital (SD) card interface or a multi-media card (MMC) interface.

The card interface 7100 may interface data exchange between a host 60000 and the controller 2100 according to a protocol of the host 60000. According to an embodiment, the card interface 7100 may support a Universal Serial Bus (USB) protocol and an InterChip (IC)-USB protocol. The card interface 7100 may refer to hardware capable of supporting a protocol that is used by the host 60000, software installed in the hardware, or a signal transmission method.

When the memory system 70000 is connected to a host interface 6200 of the host 60000, such as a PC, a tablet PC, a digital camera, a digital audio player, a cellular phone, a console video game hardware, or a digital set-top box, the host interface 6200 may perform data communication with the memory device 2200 through the card interface 7100 and the controller 2100 in response to control of a microprocessor 6100.

According to embodiments of the invention, by three-dimensionally stacking memory cells, the integration density of a semiconductor device may be improved. In addition, a semiconductor device with a stabilized structure and improved reliability may be provided.

What is claimed is:

1. A method of manufacturing a semiconductor device, the method comprising:
   forming a stacked structure with first material layers and second material layers that are stacked alternately with each other;
   forming a first slit that passes through the stacked structure;
   forming a second slit that passes through the stacked structure;
   forming a contact hole between the first slit and the second slit that passes through the stacked structure;
   forming a sealing layer that seals the first slit, the second slit, and the contact hole;
   forming first openings that pass through the sealing layer and partially expose the first slit;
   forming a first slit insulating layer in first exposed regions and first sealing regions included in the first slit, the first exposed regions being portions of the first slit that are exposed through the first openings and the first sealing regions being portions of the first slit that are sealed by the sealing layer;
   etching the sealing layer to open the contact hole; and
   forming a first contact plug in the contact hole.

2. The method of claim 1, wherein the forming of the first openings comprises:
   forming a mask pattern to partially expose the first slit on the sealing layer; and
   etching the sealing layer by using the mask pattern as an etch barrier.

3. The method of claim 1, wherein the forming of the first slit insulating layer comprises depositing an insulating material in the sealing regions through the first openings and the first exposed regions.

4. The method of claim 1, wherein the etching of the sealing layer comprises etching the sealing layer without a mask pattern.

5. The method of claim 1, wherein the etching of the sealing layer is performed through an etch-back process.

6. The method of claim 1, wherein the forming of the sealing layer comprises sealing inlets of the first slit, the second slit, and the contact hole with a material that has poor step coverage.

7. The method of claim 1, further comprising:
forming second openings that pass through the sealing layer and partially expose the second slit; and
forming a second slit insulating layer in second exposed regions and second sealing regions included in the second slit, the second exposed regions being portions of the second slit that are exposed through the second openings and the second sealing regions being portions of the second slit that are sealed by the sealing layer.

8. The method of claim 7, wherein the second openings are formed when the first openings are formed, and
wherein the second slit insulating layer is formed when the first slit insulating layer is formed.

9. The method of claim 1, wherein the stacked structure includes a first portion that is located between the first slit insulating layer and the second slit insulating layer, and a second portion that is located in areas other than areas between the first slit insulating layer and the second slit insulating layer.

10. The method of claim 9, further comprising:
forming third slits that are located on the second portion;
sealing the third slits with the sealing layer;
forming third openings that pass through the sealing layer and expose the third slits, respectively; and
forming third slit insulating layers in the third slits, respectively.

11. The method of claim 10, wherein the third openings are formed when the first openings are formed, and
wherein the third slit insulating layers are formed when the first slit insulating layer is formed.

12. The method of claim 10, further comprising replacing first material layers of the second portion with third material layers by using the third slit insulating layers as a support.

13. The method of claim 12, wherein the replacing of the first material layers with the third material layers comprises:
forming a fourth slit that is located on the second portion;
forming fourth openings by selectively etching the first material layers of the second portion through the fourth slit; and
forming conductive layers in the fourth openings.

14. The method of claim 13, further comprising forming second contact plugs that are coupled to the conductive layers, respectively, in the second portion.

15. The method of claim 1, further comprising, before the forming of the stacked structure:
forming a peripheral circuit;
forming a source structure on the peripheral circuit; and
forming an interconnection structure, coupled to the peripheral circuit, passing through the source structure.

16. The method of claim 15, wherein the first contact plug is electrically coupled to the interconnection structure.

17. A method of manufacturing a semiconductor device, the method comprising:
forming a stacked structure with a cell region and a contact region;
forming a channel structure that passes through the cell region of the stacked structure;
forming a first slit that passes through the contact region of the stacked structure;
forming a contact hole that passes through the contact region of the stacked structure;
forming a sealing layer that seals the first slit and the contact hole;
forming a mask pattern that partially exposes the first slit on the sealing layer;
forming first openings that partially expose the first slit, by etching the sealing layer using the mask pattern as an etch barrier;
forming a first slit insulating layer in exposed regions and sealing regions included in the first slit, the exposed regions being portions of the first slit that are exposed through the first openings and the sealing regions being portions of the first slit that are sealed by the sealing layer;
etching the sealing layer to open the contact hole; and
forming a first contact plug in the contact hole.

18. The method of claim 17, wherein the etching of the sealing layer comprises etching the sealing layer without a mask pattern.

19. The method of claim 17, wherein the etching of the sealing layer is performed through an etch-back process.

20. The method of claim 17, further comprising:
replacing first material layers of the stacked structure with conductive layers, the first material layers and second material layers stacked alternately with each other in the stacked structure; and
forming second contact plugs that are coupled to the conductive layers, respectively, in the contact region.

* * * * *